US011011913B2

(12) United States Patent
Smith et al.

(10) Patent No.: US 11,011,913 B2
(45) Date of Patent: May 18, 2021

(54) MULTIFUNCTION POWER MANAGEMENT SYSTEM

(71) Applicant: Flex Power Control, Inc., Woodland Hills, CA (US)

(72) Inventors: Gregory Smith, Woodland Hills, CA (US); Lloyd Linder, Woodland Hills, CA (US); Robert Dawsey, Woodland Hills, CA (US); David Ouwerkerk, Woodland Hills, CA (US); May Jang, Woodland Hills, CA (US); James T. Burdette, Woodland Hills, CA (US); Ted Peterson, Woodland Hills, CA (US); George Bellino, Woodland Hills, CA (US)

(73) Assignee: Flex Power Control, Inc., Woodland Hills, CA (US)

( * ) Notice: Subject to any disclaimer, the term of this patent is extended or adjusted under 35 U.S.C. 154(b) by 11 days.

(21) Appl. No.: 16/258,277

(22) Filed: Jan. 25, 2019

(65) Prior Publication Data

US 2020/0244071 A1    Jul. 30, 2020

(51) Int. Cl.
*H02J 3/38* (2006.01)
*G06F 1/3203* (2019.01)
*B60L 53/62* (2019.01)
*H02J 7/35* (2006.01)
*B60L 50/60* (2019.01)
*H01L 31/02* (2006.01)

(52) U.S. Cl.
CPC .............. *H02J 3/383* (2013.01); *B60L 50/60* (2019.02); *B60L 53/62* (2019.02); *G06F 1/3203* (2013.01); *H01L 31/02021* (2013.01); *H02J 7/35* (2013.01)

(58) Field of Classification Search
CPC ....... H02J 3/383; H02J 7/35; H01L 31/02021; G06F 1/3203; B60L 53/62; B60L 50/60
See application file for complete search history.

(56) References Cited

U.S. PATENT DOCUMENTS

| | | | | |
|---|---|---|---|---|
| 2013/0274940 | A1* | 10/2013 | Wei | G06Q 50/06 700/291 |
| 2016/0011617 | A1* | 1/2016 | Liu | G05B 15/02 700/287 |
| 2017/0168516 | A1* | 6/2017 | King | H02J 9/062 |

* cited by examiner

*Primary Examiner* — Thomas C Lee
*Assistant Examiner* — Charles Cai
(74) *Attorney, Agent, or Firm* — Smyrski Law Group, A P.C.

(57) ABSTRACT

A dwelling power management system includes a smart power integrated node located at a dwelling and configured to transit information to and receive information from a remote server arrangement. The smart power integrated node selectively controls power applied to dwelling electrical power hardware components according to a recommended operating procedure (ROP). The system also includes a utility switch connected to the smart power integrated node, the utility switch configured to control distribution of electrical power received from a dwelling external power source. The smart power integrated node transmits dwelling power usage information and dwelling user preferences to the remote server arrangement that evaluates relevant information including dwelling power usage information and dwelling user preferences and dwelling external factors to develop an optimized ROP. The smart power integrated node operates according to the optimized ROP.

20 Claims, 18 Drawing Sheets

MULTIFUNCTION POWER MANAGEMENT SYSTEM

BACKGROUND OF THE INVENTION

Field of the Invention

The present invention relates generally to power systems, and more specifically a power system usable in a residential structure capable of efficiently and effectively providing power to modern electronic devices used in and around the home.

Description of the Related Art

Currently available devices are becoming more complex and in general have specific power delivery requirements. The days of simple standard wiring are becoming a thing of the past. Electric vehicles, solar units, personal devices such as smart phones, and so forth require highly accurate AC and DC power delivery in as efficient a manner as possible.

Current standard U.S. residential power delivery generally consists of 120 or 220 volt power, alternating current. Newer and more complex systems with specific voltage, current, and power requirements are coming online, and management of such voltage, current, and power requirements raises challenges in delivering adequate power at acceptable levels. In certain instances, based on simple physics and physical constraints of energy sources and sinks in the residence, limitations may exist and/or operation of multiple devices at full power for extended periods of time may be challenging.

Further, the possibility of energy storage is becoming of greater interest. Collection of energy from sources including but not limited to solar cells and wind devices require storage devices. Further, when energy has been collected in a device, management of such energy is required, including complimenting such energy with energy from exterior sources such as a power company. Typical dwellings do not have such devices or abilities to control power storage and use.

It would therefore be advantageous to provide a system that allows for accurate and adequate control of power distribution in a dwelling that includes a variety of electrical and electronic components, such as power collection and storage components. Such a device would preferably overcome limitations in residential or dwelling electric power designs while improving overall system reliability.

SUMMARY OF THE INVENTION

According to one embodiment of the present design, there is provided a dwelling power management system configured to interface with a remote server arrangement, the dwelling power management system comprising a smart power integrated node located at a dwelling and configured to transit information to and receive information from the remote server arrangement, wherein the smart power integrated node controls power applied to dwelling electrical power hardware components according to a recommended operating procedure (ROP), and a utility switch connected to the smart power integrated node, the utility switch configured to interface with dwelling external power sources and a dwelling power distribution arrangement. The smart power integrated node is configured to transmit dwelling power usage information and dwelling user preferences to the remote server arrangement and the remote server arrangement is configured to evaluate relevant information including dwelling power usage information and dwelling user preferences and dwelling external factors to develop an optimized ROP. The remote server arrangement is configured to transmit the optimized ROP to the smart power integrated node, and the smart power integrated node is configured to operate according to the optimized ROP.

According to a further embodiment, there is provided a dwelling power management system comprising a smart power integrated node located at a dwelling and configured to transit information to and receive information from a remote server arrangement, wherein the smart power integrated node selectively controls power applied to dwelling electrical power hardware components according to a recommended operating procedure (ROP), and a utility switch connected to the smart power integrated node, the utility switch configured to control distribution of electrical power received from a dwelling external power source. The smart power integrated node is configured to transmit dwelling power usage information and dwelling user preferences to the remote server arrangement and the remote server arrangement is configured to evaluate relevant information including dwelling power usage information and dwelling user preferences and dwelling external factors to develop an optimized ROP. The remote server arrangement is configured to transmit the optimized ROP to the smart power integrated node, and the smart power integrated node is configured to operate electrical hardware devices in the dwelling according to the optimized ROP.

According to another embodiment, there is provided a dwelling power management system comprising a smart power integrated node located at a dwelling and configured to transit information to and receive information from a remote server arrangement, wherein the smart power integrated node controls power applied to dwelling electrical power hardware components according to a recommended operating procedure (ROP) and a utility switch connected to the smart power integrated node, the utility switch configured to interface with dwelling external power sources and a dwelling power distribution arrangement. The smart power integrated node is configured to transmit dwelling power usage information and dwelling user preferences to the remote server arrangement and the remote server arrangement is configured to receive external dwelling relevant information and process received information to develop an optimized ROP. The remote server arrangement is configured to transmit the optimized ROP to the smart power integrated node and smart power integrated node is configured to operate electrical hardware devices in the dwelling according to the optimized ROP.

These and other advantages of the present invention will become apparent to those skilled in the art from the following detailed description of the invention and the accompanying drawings.

BRIEF DESCRIPTION OF THE DRAWINGS

For a more complete understanding of the present disclosure, reference is now made to the following figures, wherein like reference numbers refer to similar items throughout the figures.

DETAILED DESCRIPTION

Figure 1:
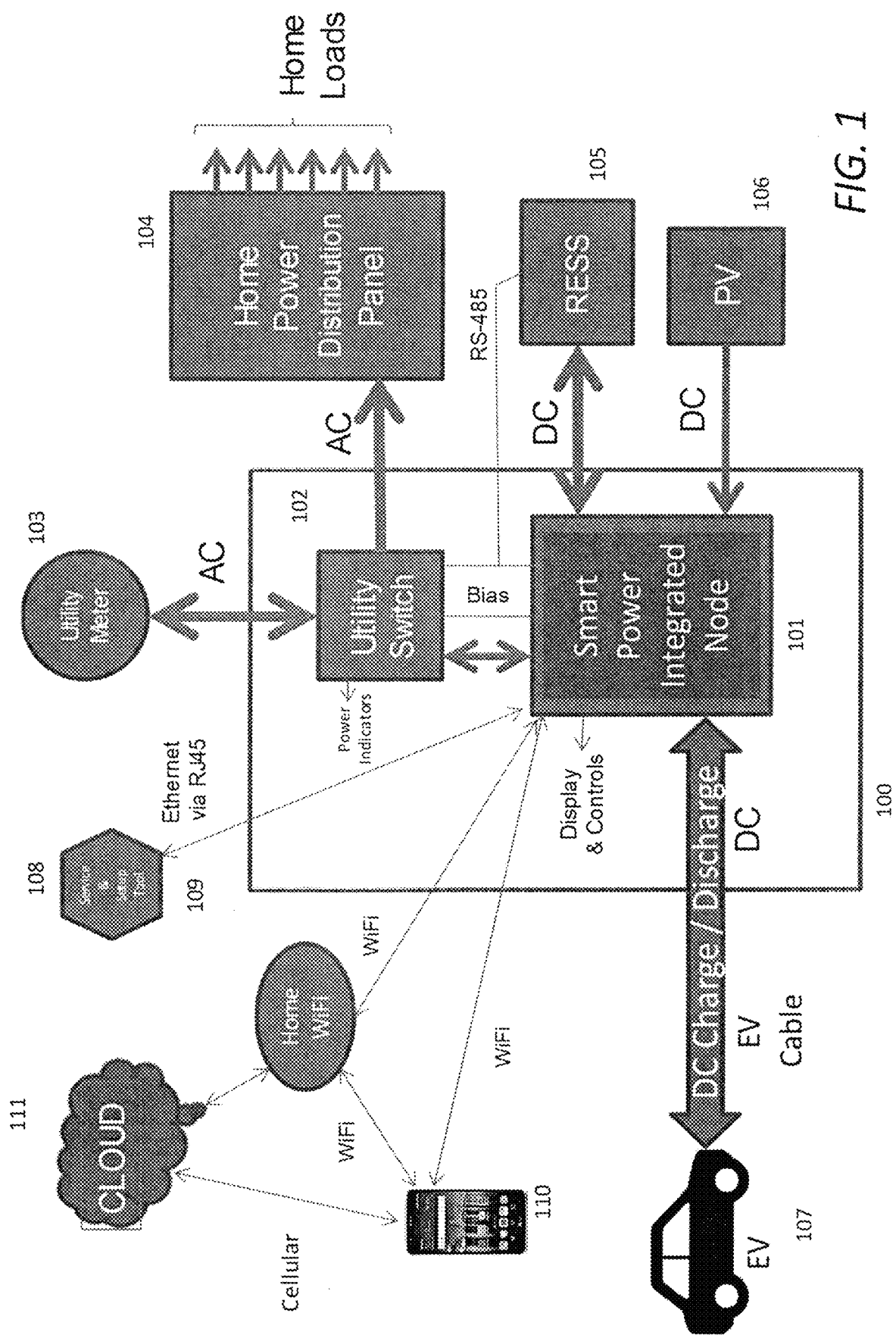
FIG. 1 is a general representation of the components of the overall design, such as within a particular dwelling.

The following description and the drawings illustrate specific embodiments sufficiently to enable those skilled in the art to practice the system and method described. Other embodiments may incorporate structural, logical, process and other changes. Examples merely typify possible variations. Individual elements and functions are generally optional unless explicitly required, and the sequence of operations may vary. Portions and features of some embodiments may be included in, or substituted for, those of others.

A reliable general integrated node that controls the flow of energy generated and utilized in a dwelling is provided. A specially functioning central node is disclosed that allows for the efficient storage and distribution of energy to a variety of newer household devices and allows for management of energy storage and distribution. In one instance, ability to monitor and change energy settings via a mobile device or via the cloud is provided. The system allows for the management of a network including various items, including but not limited to dwelling energy sources and storage, grid energy, and electric vehicles (EVs). An EV is also an energy storage unit that can provide energy to the home or the grid. The network may also include a Rechargeable Energy Storage System (RESS), solar panel array, non-smart appliances and non-smart energy loads, and smart appliances and smart energy loads.

The system described herein provides functionality including a hardware controller unit that controls the flow of energy sources and storage. The controller unit is a source of data statistics for the energy utility and the potential virtual power plant capability over the internet, i.e. in the cloud. A virtual power plant (VPP) is a cloud based distributed power plant that aggregates the capacities of heterogeneous Distributed Energy Resources (DERs) for the purpose of enhancing power generation and potentially trading or selling power on the open market. Data from the controller unit can be used to participate in transactive energy activities, where transactive energy refers to economic and control techniques used to manage the flow or exchange of energy within an existing electrical power system with regards to economic and market based standard values of energy.

The controller unit represents a source of data to analytics in the cloud for prediction, management, and optimization in an analytics software engine for the dwelling. The controller unit can be a Distributed Energy Resource (DER) extension to the utility, or power company (communications and monitoring), by providing utility constraint information to the cloud for inclusion in prediction and optimization. Website and application communication through, for example, WiFi with the controller unit and a cloud based database may be provided. The system may also provide an intelligent switch providing utility power control to the home, providing grid voltage and current sensing, allowing control of islanding/microgrid operation, allowing control of the home when no utility/grid power is present, providing a disconnect from the grid and providing power to the dwelling if the controller unit fails.

One representation of the design is provided in FIG. 1. From FIG. 1, there is provided a central system 100 including a smart power integrated node 101 connected to utility switch 102. Utility switch 102 has a connection to utility meter 103 as well as home power distribution panel 104. The control unit is connected to RESS (rechargeable energy storage system) 105 and has a connection to photovoltaic cell 106. A service and setup tool 108 communicates with smart power integrated node 101 via available means, including but not limited to via Ethernet (RJ45). Also communicating with smart power integrated node 101 is home Wifi 109, with smart phone 110 and cloud 111. Smartphone 110 may represent any type of electronic communication device (PC, tablet, etc.) and multiple such devices may be provided. The smartphone 110 or similar device may communicate with the cloud via cellular connection, Wifi, or any available communication protocol.

As shown in FIG. 1, utility switch 102 connects to the utility meter 103 via AC (alternating current). The utility switch 102 connects to home power distribution panel 104 using AC, and as shown in FIG. 1 home loads are provided by home power distribution panel 104. Controller 105 is connected to smart power integrated node 101 via DC (direct current), and photovoltaic cell also connects to control unit 101 via DC. The smart power integrated node 101 provides DC charge and discharge capability to electric vehicle 107. In this embodiment, the connection to electric vehicle 107 is an EV cable. Controls are provided, along with reset capability, and on/fault indicators are provided from smart power integrated node 101. Utility switch 102 may provide power indicators and is connected to smart power integrated node 101 and may include a bias.

Figure 2:
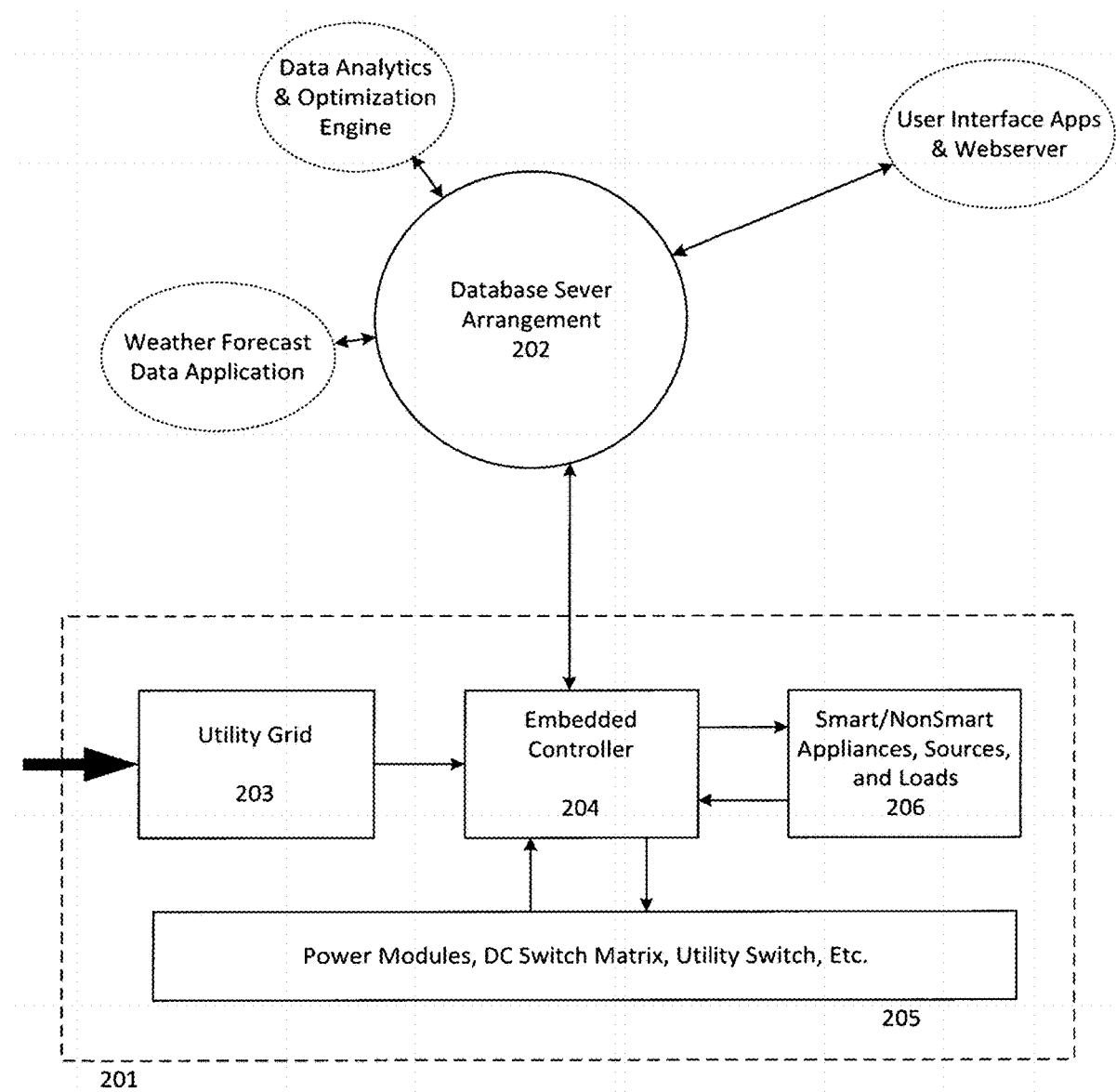
FIG. 2 is a representation of the system including the remote server arrangement including the database server.

The system receives a recommended operating procedure (ROP) from a remote analytics device, or such a ROP may be provided with the system of FIG. 1. FIG. 2 is an overview of the entire system, with the smart power integrated node 201 being similar or identical to the smart power integrated node 101 of FIG. 1. A remote database server 202 receives data analytics and optimization and seeks to collect and provide optimal settings to each dwelling based on circumstances encountered. Data forecast and weather information may be collected and employed, as well as user interface input, such as commands provided by a user via a user device. All of this information is collected and processed to deliver an updated ROP or energy profile for the particular dwelling. Thus according to the present design, user input and weather and any other relevant factors (e.g. devices that are offline or nonoperational) are processed based on the optimization engine, including data analytics previously determined. For example, if EV owners in Anytown, USA tend to decrease their air conditioning power needs during the third week in September, the optimization engine may provide a command or recommendation to maintain less power than otherwise maintained at a dwelling in Anytown in the third week of September.

Further, from FIG. 2, the dwelling system smart power integrated node 201 in this embodiment includes a utility grid 203, embedded controller 204, and power modules, DC switch matrix, utility switch, and other electrical power control devices 205. Smart and non-smart appliances, sources, and loads 206 are also represented. Thus the smart power integrated node 201 includes more than a control device, but may also include electronics joining to the utility grid for controlling the power provided from and in some cases to the utility grid, power modules, switch matrices, and other electrical control devices that provide control and facilitate the supply of power to the various components provided in the dwelling.

The smart power integrated node thus takes collected analytics with respect to consumer (or dwelling operator) energy usage data, and using analytics in conjunction with energy sources and loads located at a dwelling. The present design optimizes the flow of energy of each of the loads and sources in the dwelling to achieve a goal as defined by the constraints for the system set by the customer, for example as established as user preferences. The consumer may request the hardware (the smart power integrated node 201) and software (cloud analytics) to provide a lowest cost operation for the energy provided to the home by the utility. The system determines and may provide a ROP to the smart power integrated node 201 that is based on a sensing of power flow within the dwelling. This information may be provided to the optimization engine of FIG. 2 and used for forecasting. This ROP (strategic information) is used in conjunction with tactical (local, within the dwelling) information, taking into account the physical limitations present in and providable to the dwelling (energy sources and loads), and the embedded controller 204 in conjunction with the optimization engine may account for unplanned occurrences in the hardware to provide an optimum energy flow to achieve the lowest cost for the consumer. Should the consumer wish to be "green," i.e. use the least energy from the power grid and the most from sources such as solar and wind (sometimes called "renewable energy"), the system may operate to utilize as much renewable energy as possible based on the load without needing or requesting energy from the grid. The user may provide preferences or selections via a computing device directly to smart power integrated node 201.

Figure 3:
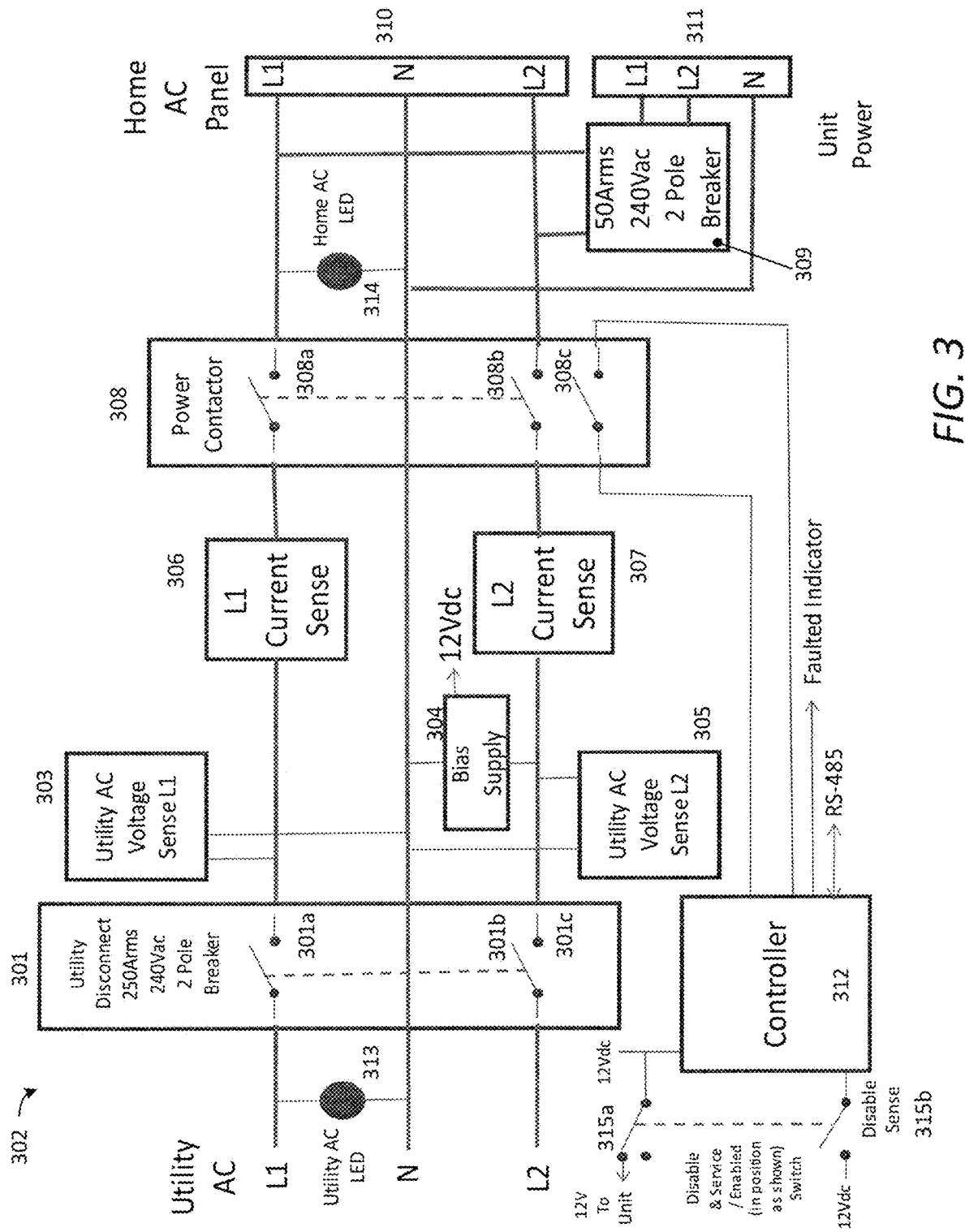
FIG. 3 represents one embodiment of a utility switch according to the present design.

A version of utility power switch 102 shown in FIG. 1 is represented in FIG. 3 as utility power switch 302. The utility power switch 302 is an intelligent switch that provides power control to the dwelling, provides grid voltage and senses current, and allows the control of "islanding" and microgrid operation. Islanding is when a generator provides power even though electrical grid power is no longer available. The utility power switch also allows for control of power in the dwelling when utility or grid power is unavailable, enables disconnection from the grid, and provides a level of power to the dwelling when the smart power integrated node 201 fails.

Utility power switch 302 includes Utility disconnect element 301 (250 Arms, 240 Vac, 2 pole breaker) including switches 301a and 301b to L1 and L2, respectively (line 1 and line 2, representing AC received from the utility or grid). Also included is a switch 301c used to turn off controller 312. Master disconnect 301 can be a lever type utility disconnect switch used to manually disconnect from Grid electrical power, that signals smart integrated power node 201 to not island but to shutdown. A neutral line is shown, and utility AC LED 313 is shown for purposes of determining whether power is being supplied from the utility or grid. AC LED 313 is a visual indicator on the outside of Utility Switch warning of Grid Power being present. Element 303 is a utility voltage sensor for the L1 line, connected to the L1 and neutral lines, while element 305 is a utility and voltage sensor for line L2, connected to the L2 and neutral lines. L1/N and L2/N are both 120 Vac but 180 degrees out of phase. L1/L2 is 240 Vac.

Bias supply 304 provides a voltage bias, and may provide 12 Vdc. Current is of importance in this embodiment, and current sensors 306 and 307 represent, respectively, line 1 current sensor and line 2 current sensor. Power contactor 308 includes three switches, namely switch 308a for switching line 1 on and off, switch 308b for switching line 2 on and off, and switch 308c for switching controller 312 on and off. Power contactor 308 serves to, in desired situations, disconnect from the grid while components to the left in this view continue to operate. Power contactor 308 may be a large AC DPST relay/contactor used to isolate the home or dwelling from the utility or grid for islanding (operating off grid using PV, Home Battery, or EV power). Home AC LED 314 between line L1 and neutral, where home AC LED 314 is used to indicate operation of the "dwelling" side of the circuitry. Home AC panel 310 receives the three lines (L1, L2, and neutral), and a 50 Arms 240V AC two pole breaker 309 is provided and connects is shown connecting to the smart power integrated node as shown by element 311. L1, L2, and neutral lines are connected to home AC panel 310 and the smart power integrated node representation 311.

Controller 312 is a controller specific to utility power switch 302, and in this view a further control connection is provided to the smart power integrated node, such as smart power integrated node 201. A 12V DC line is provided that connects controller 312 with the smart power integrated node, and a disable sense line that also connects to the smart power integrated node. As shown in FIG. 3, switches 315a and 315b offer the ability to selectively enable and disable control signals and sensing being provided on these two lines to the smart power integrated node. Also provided by the controller 312 is an RS-485 connection and a faulted indicator.

Figure 4:
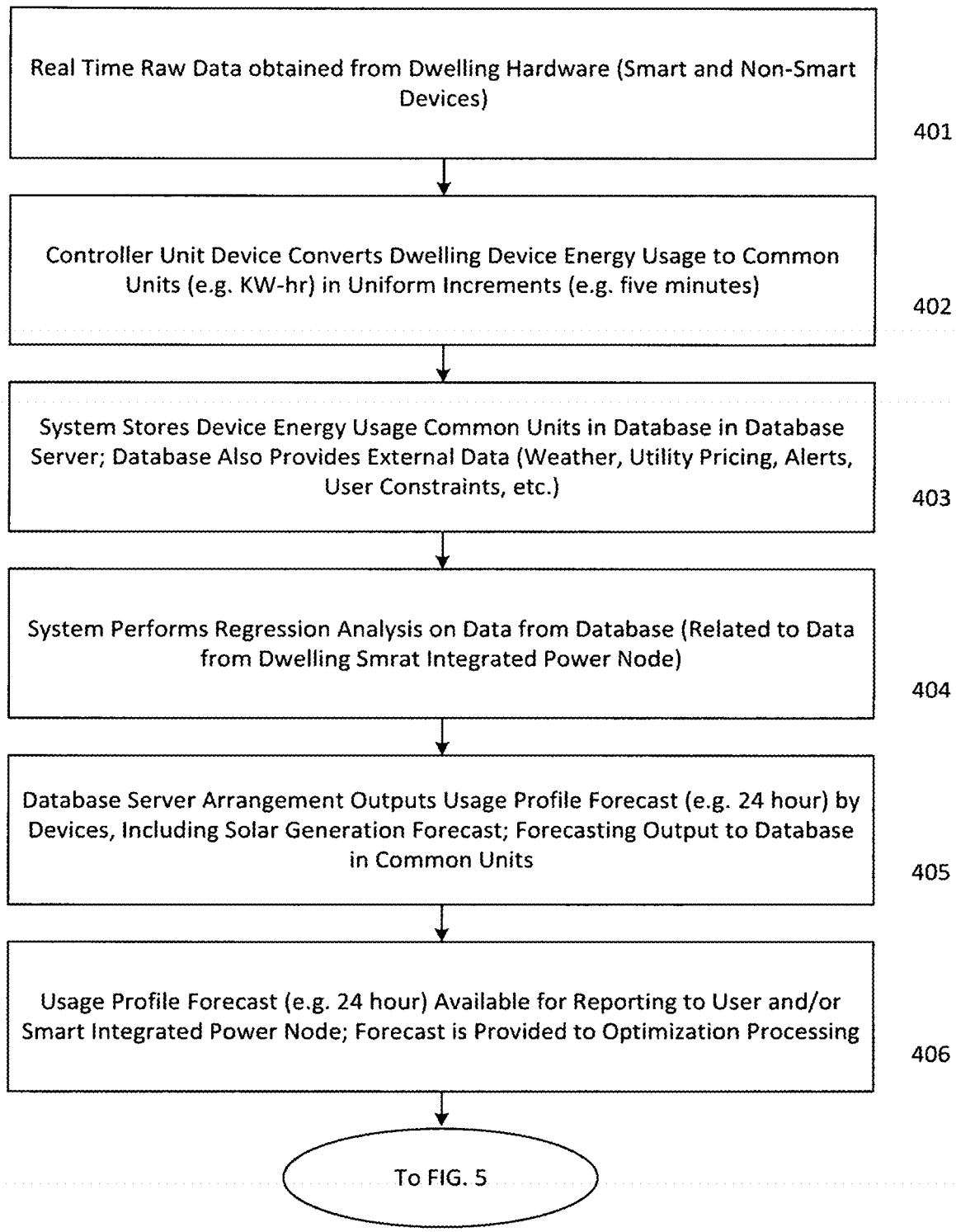
FIG. 4 illustrates forecast analytics operation.

FIG. 4 is a general flow diagram for forecast analytics. From FIG. 4, real time raw data is collected from smart power integrated node hardware, including all devices (smart and non-smart) at point 401. The smart power integrated node converts device energy usage to common units, such as kilowatts per hour, in regular time increments, such as every five minutes at point 402. The device energy usage common storage units are transmitted by the smart power integrated node to the central database at point 403. Point 404 represents a regression algorithm processing, primarily to predict continuous energy outputs over periods of time for multiple dwellings or users. The system at point 405 collects weather data and determines a 24 hour energy expected usage profile (or other time period), accounting for added power such as solar power contributions, possible stored power. The result, shown at point 406, is a usage forecast which may be viewed by the owner/resident, establishing an energy usage profile and expected energy use from the grid for a particular period. This result is provided to optimization processing, shown in FIG. 5.

Figure 5:
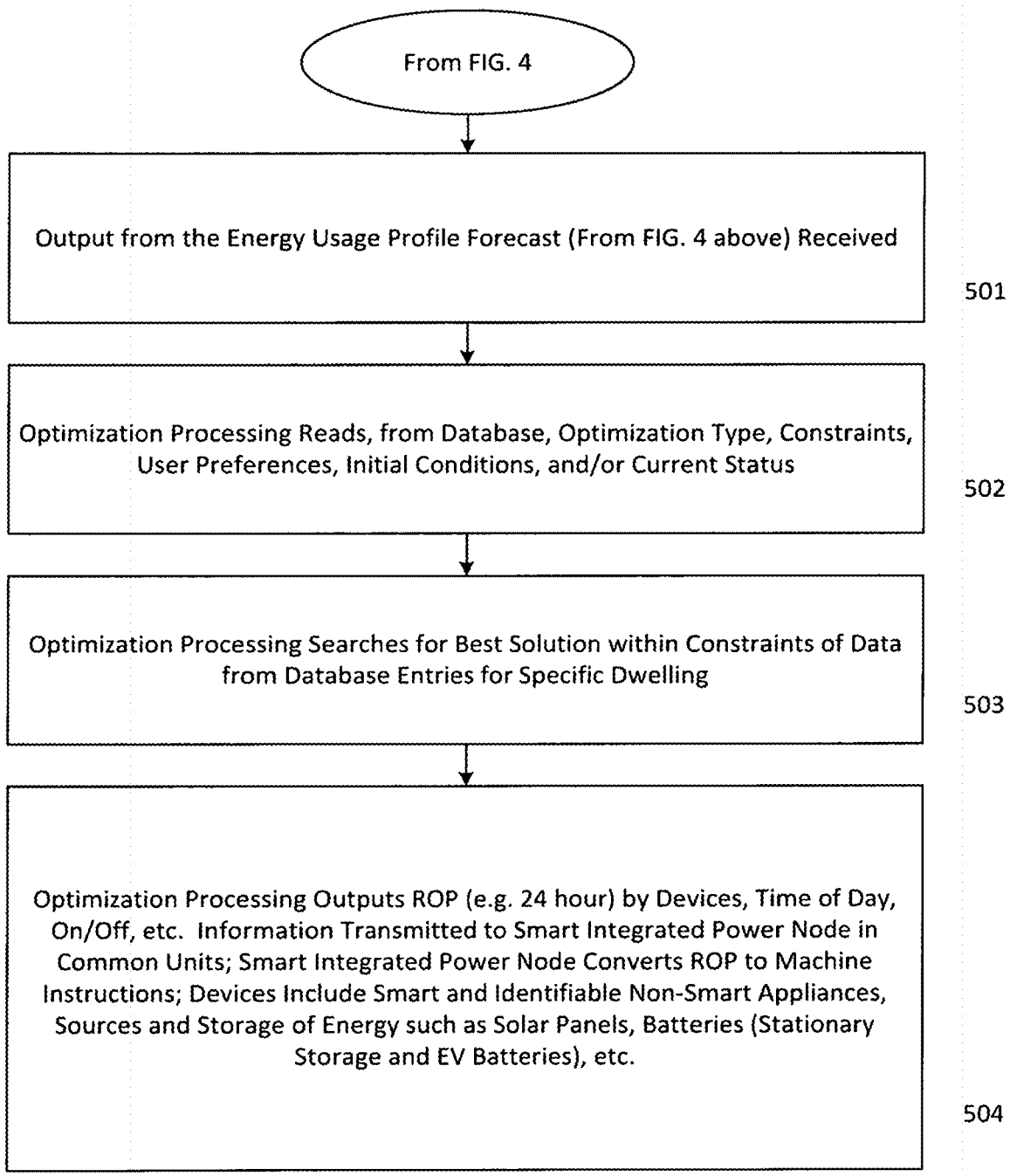
FIG. 5 is the optimization analytics operation according to the present design.

FIG. 5 begins at point 501 with the determined energy usage proposal. Such a profile may be stored in the common database, such as in common units and established increments—KW-hr at 5 minute increments. The optimization processor at point 502 reads from the database, and may read values such as optimization type (low cost, green energy, etc.), constraints (e.g. solar cells offline, limited power connection to electric vehicle, component X of the dwelling system down or compromised, etc.), user preferences, initial conditions, and current status of the dwelling and the grid. The information read may include micro (at the dwelling) and macro (across all known devices and networks) conditions and relevant values. The optimization algorithm at point 503 takes all inputs—weather, user input, historical data, predicted data, dwelling data, constraint data, utility pricing, alerts, user constraints—and searches for a best power profile. At point 504, the optimization results in a recommended operating procedure (ROP) of devices, on/off times, and may be a real time ROP, issuing commands as needed. The remote database and remote server(s) may transmit the ROP to the smart power integrated node, such as in the common units, with device identifier and desired increments. The smart power integrated node converts the ROP to instructions for execution and may execute them immediately if desired. Sources of energy, such as solar panels, batteries, (stationary energy and EV batteries) are considered. The result is an around-the clock baseline energy profile which can be changed depending on micro (tactical) or macro (strategic) conditions encountered and/or user input. For example, if the user wants the electric vehicle to stop being charged, that energy can be stored or saved and accounted for, or distributed, in subsequent operation.

Processing Functionality

Controller software is composed of three main parts, the locally embedded master control program, a relational database manager, and a predictive analytics forecasting and optimization engine. The overall software architecture is database-centric, binding the various pieces together, thereby eliminating the need for a complex hierarchy of specific Application Programming Interface (API) requirements. In the present design, the database schema drives inter-application communication and data flow. A database driven design alleviates the need for hard-wiring of input and output configurations in the executable code, making the resulting control application program more flexible, maintainable and extensible. The database input and output definition values drive operation of the executable applications.

Figure 6A:
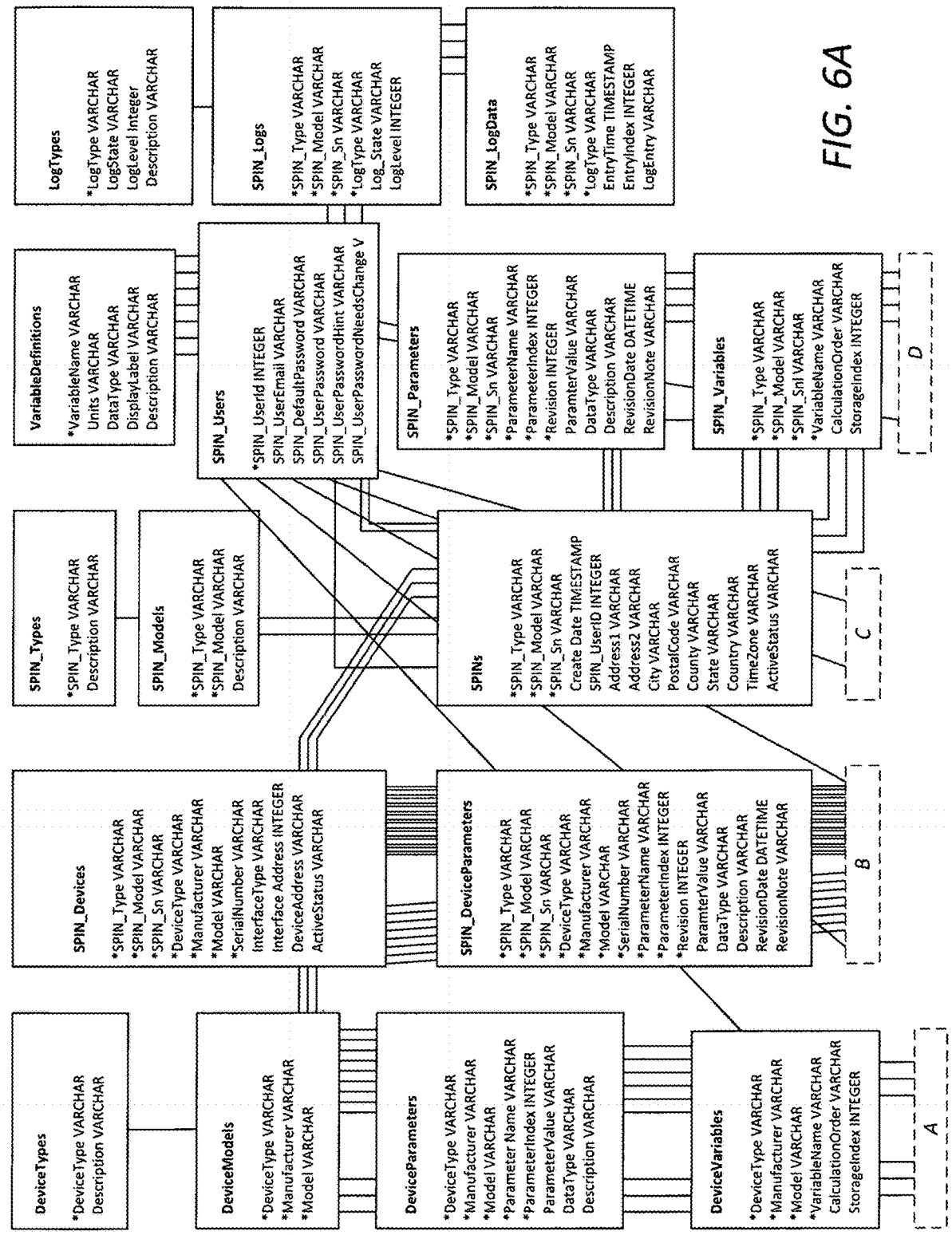
FIGS. 6A and 6B represent schemas employed in one embodiment of the design.
Figure 6B:
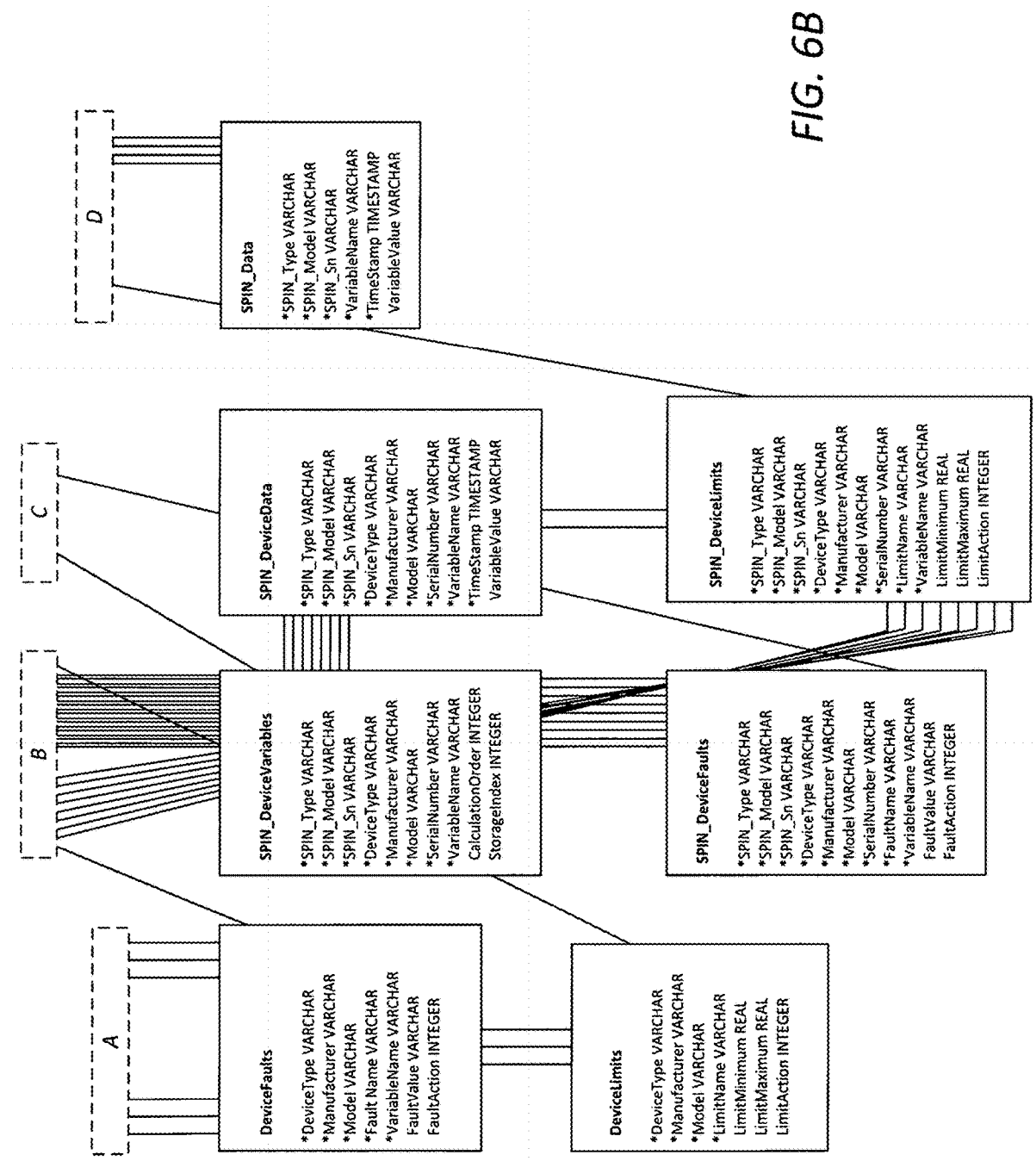

The SPIN database schema is shown graphically in FIGS. 6A and 6B. In the representation of FIGS. 6A and 6B, the name "SPIN" is employed to represent the system, and as used herein, other names such as "dwelling" are employed.

The analytics engine for the system includes statistical forecasting in R and numerical optimization in CMPL. The system provides a system "wrapper" in Python, which calls SQL to access data stored in the database. The system rearranges relational data from the database and stores the rearranged data in another database to facilitate performing necessary analysis. The Python then wrapper calls R and CMPL to perform the analyses, and writes the output back to the database. The system stores data inputs to the forecasting and optimization models in a database table, with node level consumption at regular, e.g. 5 minute, intervals. The system passes data is passed from the database to the software components in memory using Python Pandas objects.

The analytics engine consists of Forecasting_Node-level.R, optimization, system wrapper, and analogous forecasting.

Figure 7:
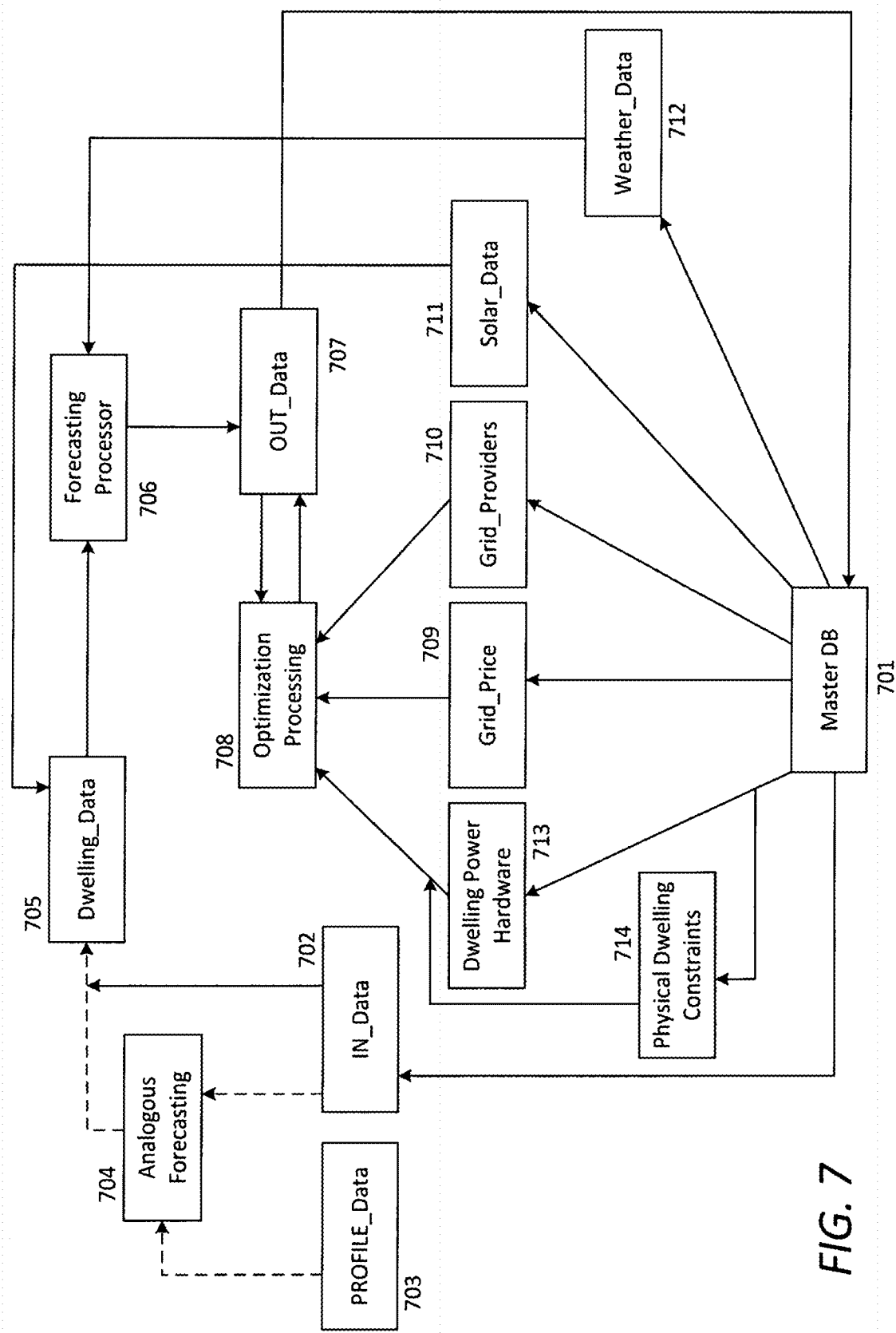
FIG. 7 shows forecasting and optimization elements in accordance with the present design.

FIG. 7 illustrates general operation of propogating recommended operating procedures to dwellings. These elements may be implemented in hardware, software, firmware, and/or any combination thereof. From FIG. 7, master database 701 provides Node level consumption data to and through IN_Data 702, representing input data. PROFILE_Data 703 is a representative consumption schedule, for example a 24 hour, 5 minute interval consumption schedule. The optimization engine discussed below assumes a regular consumption forecast, such as a 24 hour consumption forecast. If in the 24 hour example, 24 hours of consumption is not available, analogous forecasting element 704 "projects" a 24 hour consumption pattern based on actual consumption and the profile based on PROFILE_Data 703. Analogous forecasting element 704 passes, in this example, the modeled 24 hour per 5 minute interval consumption to Dwelling_Data element 705.

The R-based forecasting algorithm takes consumption and solar generation history from Dwelling_Data element 705 and uses a "Random Walk" model as described in the forecasting algorithm section below. Forecasting algorithm element 705 passes the day ahead 24 hour per 5 minute consumption forecast to OUT_Data element 707, representing an element including data to be transferred out to the dwelling.

The optimization algorithm processor 708, which in one embodiment may employ or comprise a Python/CMPL Optimization Algorithm, obtains or receives the "day ahead" consumption and solar forecast, the solar forecast from solar data element 711, and cost information in the cost table, represented in this embodiment by grid price element 709 and grid providers element 710, Dwelling information within Dwelling element 713, which may include a Dwelling table, to create a Recommended Operating Procedure (ROP) using a cost based optimization routine, discussed below. Physical constraints of the dwelling 714 are also provided to the optimization algorithm processor 708. Optimization algorithm processor 708 may pass the ROP to OUT_Data element 707.

The system then provides the ROP to the master database 701 for use by a master controller program for implementation and execution.

With respect to forecasting processing, forecasting processing obtains a consumption history and a solar generation history, executes forecasting processing, and outputs expected consumption and solar generation details back into the system and dwelling databases.

R-based forecasting algorithm extracts needed data, in one embodiment electricity usage and/or solar generation from the Dwelling_Data element 705, performs forecasting processing as described below, and passes a similar structure, but with the time stamp pushed forward by one day.

Various models may be employed separately or in combination for forecasting for dwelling systems. A random walk forecasting model may be employed that uses historical data as an input and uses the previous day's weather and energy need forecast as the forecast for the next day. As users put new devices online (i.e., a new EV), the model notices the energy increase in the day the device comes online, and the next day the model includes the increased energy need in the forecast. Random walk processing tends not to take into account other external factors, such as weather, day of week, and as a result day-to-day variations in power usage are not predicted with a high degree of accuracy.

The system may alternately employ simple average forecasting. Simple average forecasting uses historical data as an input and averages the past N days of data to give the forecast for the next day. Any number can be used, but observations indicate that 30, 40, or more may be useful. The simple average tends to smooth out peaks or dips in usage, and generally gives an accurate daily forecast.

The third model that may be employed in forecasting is a regression model. A regression model uses a number of inputs and parameters to predict the next 24 hours usage, such as historical data and time series characteristics. One forecasting model uses weather data in addition to historical data and time series characteristics. An example of regression processing is as follows:

Device usage=$b1$*constant+$b2$*time of day+$b3$*day of week+$b4$*month

Independent variables in the regression model are dummy variables related to time. The regression model calculates coefficients (i.e., b1, b2, b3, b4) for each variable.

Additional forecasting models or processing may be employed, such as in combination with the foregoing processing. Weather forecasting may be employed, for example a regression-based forecast model for solar generation that uses weather-related variables as independent variables.

Such a model may take the following form:

Solar generation=$b1$*constant+$b2$*time of day+ $b3$*day of week+$b4$*month+$b5$*temperature+ $b6$*visibility.

The system may employ a best fit model selection, and/or curve fitting may be employed. The system may select a desired model based on "out-of-sample" forecast performance. The system determines the desired model based on length of input data available as well as statistical properties (trend, seasonality, correlation with weather, etc.) of the input data.

The system may alternately or additionally employ analogous forecasting. Using a 24 hour/5 minute interval node level consumption forecast, in order to use any of the forecasting techniques described above, the system needs at least 24 hours of actual consumption (or solar generation) history. In some dwellings 24 hours worth of information may be unavailable. In such a situation, the system may instead employ an estimated typical household consumption profile. Analogous forecasting uses this profile to project 24 hours of consumption based on the limited consumption data available.

Analogous forecasting may determine a time window of available data, and may map this time window into the typical household profile, determine the relative magnitude of 24 hour consumption, reduce to the typical household total consumption, and apply the total consumption value to the 24 hour profile to come up with the 24 hour/5 minute interval forecast.

With respect to optimization processing, the optimization model or processor collects the forecast for the next day's consumption and the next day's solar generation forecast, as well as necessary inputs such as the grid price schedule and additional utility constraints. The optimization processing then outputs the daily Recommended Operating Procedure back into OUT_Data, which then passes the ROP to Dwelling_Data in the database.

In one embodiment, optimization processing employs CMPL programming software and is a mathematical model (Mixed Integer Program). Alternately, a simple heuristic algorithm may be employed. A simple heuristic algorithm is a set of instructions that meet system constraints and generate a feasible solution. One example of such a heuristic electricity choice algorithm contemplates inputting the expected consumption forecast for the next period of time, such as the next 24 hours, as well as the weather forecast (i.e., temperature, sky cover percentage, etc.) Processing then calls for determining the state of any available storage device available to the dwelling, such as a storage battery (ability to use if needed, or to charge if possible). The system then determines the state of any specific components, such as an EV, including the need for charging and possibility to use the device to provide charge to the storage device.

The system then determines if the weather allows for any power generation that day. If the weather is bad, the system is directed to consume from the storage source, available plug-in EV (DC only), or the grid. This decision may differ depending on the user's optimization preference and available storage device status (i.e., minimize cost, use only green energy, etc.) If, however, the weather is acceptable, the system decides whether to consume solar energy, charge the storage device, charge any available EV, or direct energy back to the grid, such as selling energy.

A mathematical solution differs from a heuristic solution in that the problem is formulated in terms of mathematical equations and uses linear algebra to find an optimal value in finite dimensional vector space. The following is an example of a mathematical program that may be employed by the present system:

Objective Function:
  Min→sum{j in Intervals, k in Source: SupplyToBattery [j,k]  *Cost[j,k]+SupplyToACBus[j,k]  *Cost[j,k]  }
  #Minimize total cost Constraints:
  {i in Devices, j in Intervals: Usage[i,j]=Forecast[i,j];}
    #Usage equals forecast
  {j in Intervals: UsageEV[j]+sum{i in Devices: Usage[i,j]}=
  SupplyToBattery [j]+sum {k in Source: SupplyToACBus [j,k] };} #Supply Demand for the AC supply
  {j in Intervals, k in Source: SupplyToBattery [j,k]+SupplyToACBus [j,k]<=
  Capacity [j,k];} #Don't use more solar than available Optimization calls for determining a daily ROP, including a recommended consumption interval for smart devices and non-smart devices, and choosing an electricity source, i.e. whether to consume power from the grid, solar, battery, or plug-in EV (DC only) when available. Node level optimization models the behavior of the entire system, and not the individual component devices. The system employs Mixed Integer Program (MIP) concepts with the following considerations about the dwelling system. The system considers one device, the Home. The Home obtains power from a common AC supply. The AC supply receives power from three sources—Solar power, the Utility Grid, and storage (including but not limited to storage battery and any EV-DC). The system may also consider power flow from the AC supply to the storage device and from the AC supply to an EV-DC. A power line is provided that supplies power to the EV-DC from the storage device, and the storage device and EV-DC have the characteristics of a battery. The system cannot exceed established charging and discharging rates, maximum battery capacity, and cannot go below maximum depth of discharge. Storage device/battery capacity increases as power is provided, and decreases as the system takes power, and the storage device has an initial charge at the beginning of optimization. The system assesses consumption and can alter consumption of the house to a less expensive time interval. While availability of an EV may vary, the system may take into account times when the EV is known to be available, such as overnight. The system may employ a power module that converts AC to DC and/or vice-versa. The system may employ two power modules at one time, such as two modules having 5 KW capacity each. More such power modules may be employed.

The system makes certain decisions to minimize costs to the consumer. The system assesses consumption of the dwelling during each time interval from the AC supply, power flow from the storage device, solar source, grid and each EV-DC to the AC supply, power flow into the storage device from the AC supply, power flow into each EV-DC from the AC supply and the storage device(s).

The system may also or alternately perform device level optimization. The device level model various types of devices in the dwelling, including but not limited to pool pump or other pump, refrigerator, air conditioner, and non-smart devices. All dwelling devices typically obtain power from a common AC supply. The AC supply may receive power from solar sources, grid, storage device, and any available EV-DC. The system matches the recommended consumption for the refrigerator, AC and other devices to forecasted demand in the desired time interval. Additionally, the system may shift consumption of individual devices (pool pump, etc.) to a cheaper time interval.

Currently the overall objective of the model is to minimize total cost. The system assesses the following factors in making this determination: consumption of every device in each time interval from the AC supply, power flow from the storage device/battery, solar source, grid and any EV-DC to the AC supply, power flow into the storage battery from the AC supply, power flow into any EV-DC from the AC supply and the storage device, and power flow into the storage device/battery from solar sources and the grid.

Based on these assessments and models, the system determines an ROP and provides the ROP to the dwelling for execution.

The system employs DER (distributed energy resources) and adds DER to existing hardware, thus enabling intelligent control of the flow of energy to the dwelling from the utility or grid. The present design also provides intelligent control of the flow of energy and loading to the individual devices in the dwelling, as well as control of grid connections.

The present design may be used to collect energy from and distribute collected energy to multiple dwellings. The system may also be used to send power back to the utility or utilities. Site preferences may be established, and energy collected at desired locations and distributed to other locations based on micro (tactical) or macro (strategic) conditions. For example, if dwelling X34 has storage capacity and is willing to receive and provide energy at cost C, a dwelling smart power integrated node at dwelling G108 may agree to transmit a quantity of energy to dwelling X34 over the grid, whereupon dwelling X34 stores the energy for a period of time. Dwelling L1212 may have an arrangement to receive electricity at a certain price, and stored energy from, for example, dwelling X34 may be provided to dwelling L1212 at that price. In many or possibly all situations, the current electrical grid may hinder or impede this capability, but future grid rules and conditions may allow for such energy distribution. Alternately, an offline or second energy transmission arrangement may be provided between dwellings to effectuate storage and distribution in this manner. Dwelling A may have an arrangement with dwelling B to provide and store energy and receive such energy under desired conditions. Such functionality may employ the teachings of the present design. In one instance, blockchain technology may be provided to store and identify viable grid and/or non-grid energy sources. Monitoring data may flow back to the central database and processing hardware, analytics such as optimization performed, and the server arrangement or central database may provide requested actions or functionality, i.e. transmit X units of energy to location Y, with cost accounting provided.

Figure 8:
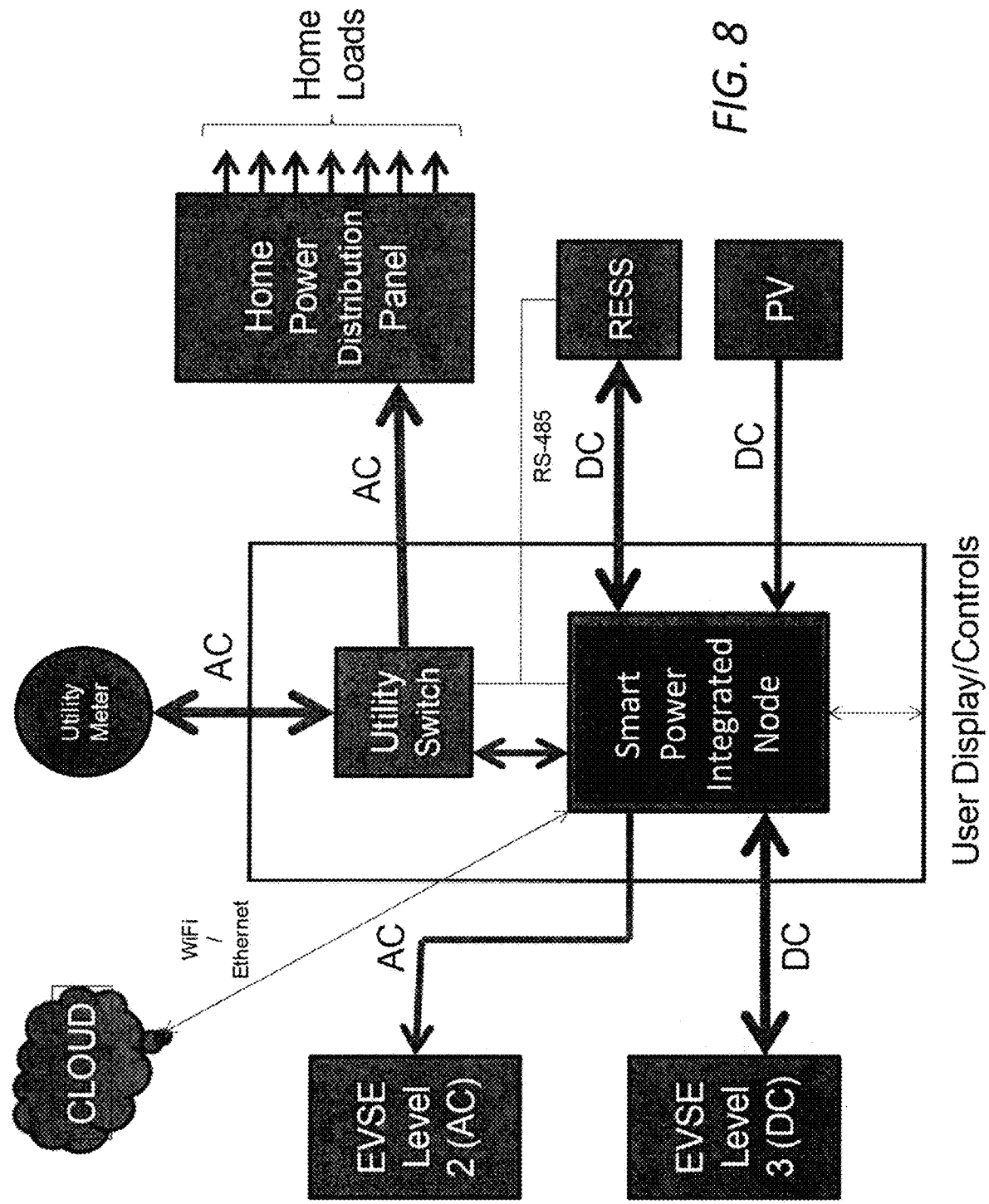
FIG. 8 illustrates an alternate representation of in-dwelling or dwelling-proximate electrical power components.

FIG. 8 represents an alternate embodiment of the design, similar to that of FIG. 1. Certain elements from FIG. 1 have been removed to show the primary electrical components in and associated with the dwelling. FIG. 8 illustrates user display and/or controls interfacing with the smart power integrated node such that the user may see the status of the various components. Such user display or controls are optional and not mandatory. Certain components and transmission lines are AC while others are DC, and the RESS in this embodiment has an RS-485 connection to both the utility switch and the smart power integrated node.

Figure 9:
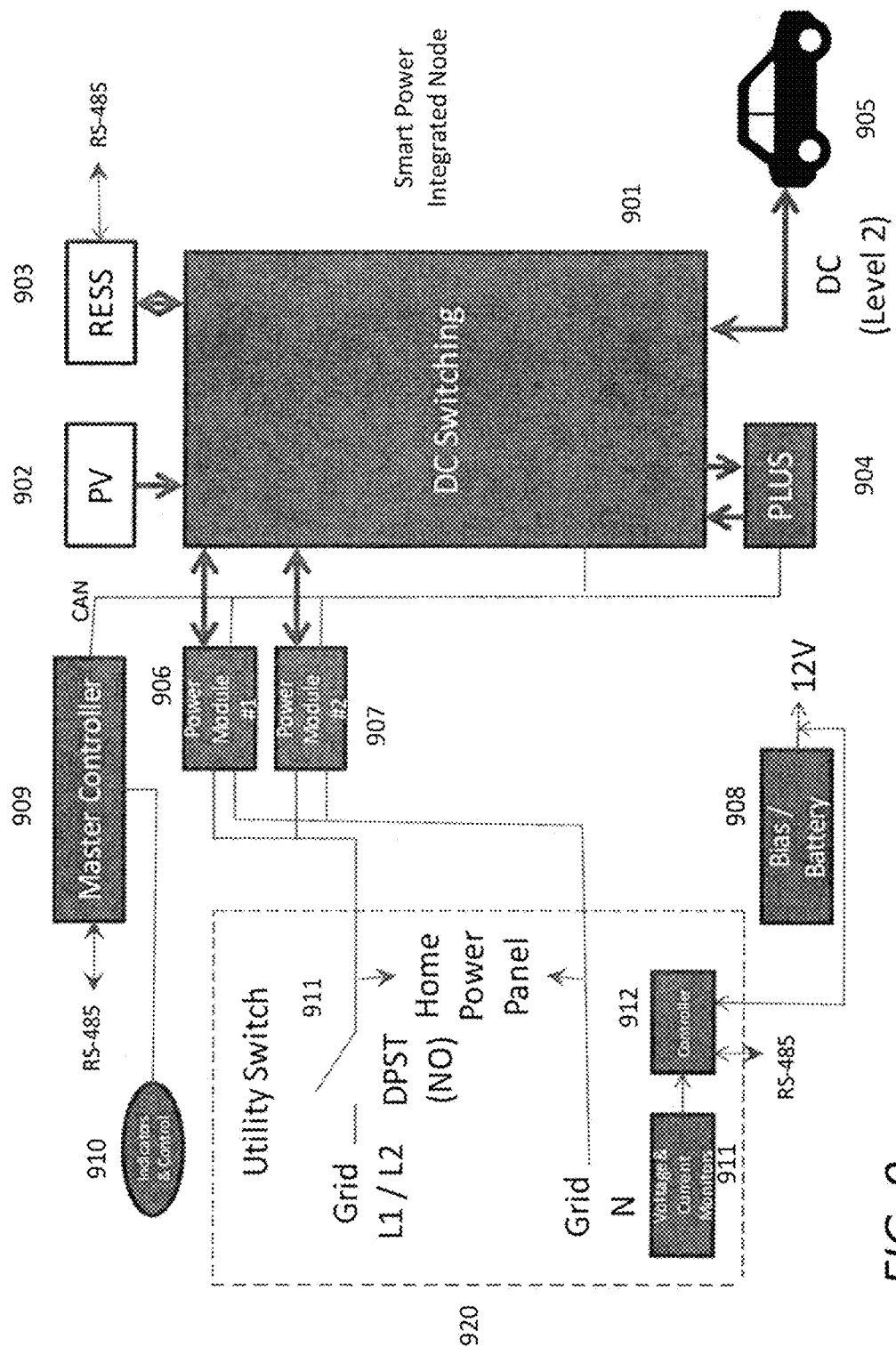
FIG. 9 is an alternate embodiment of the utility switch and smart power integrated node.
Figure 10:
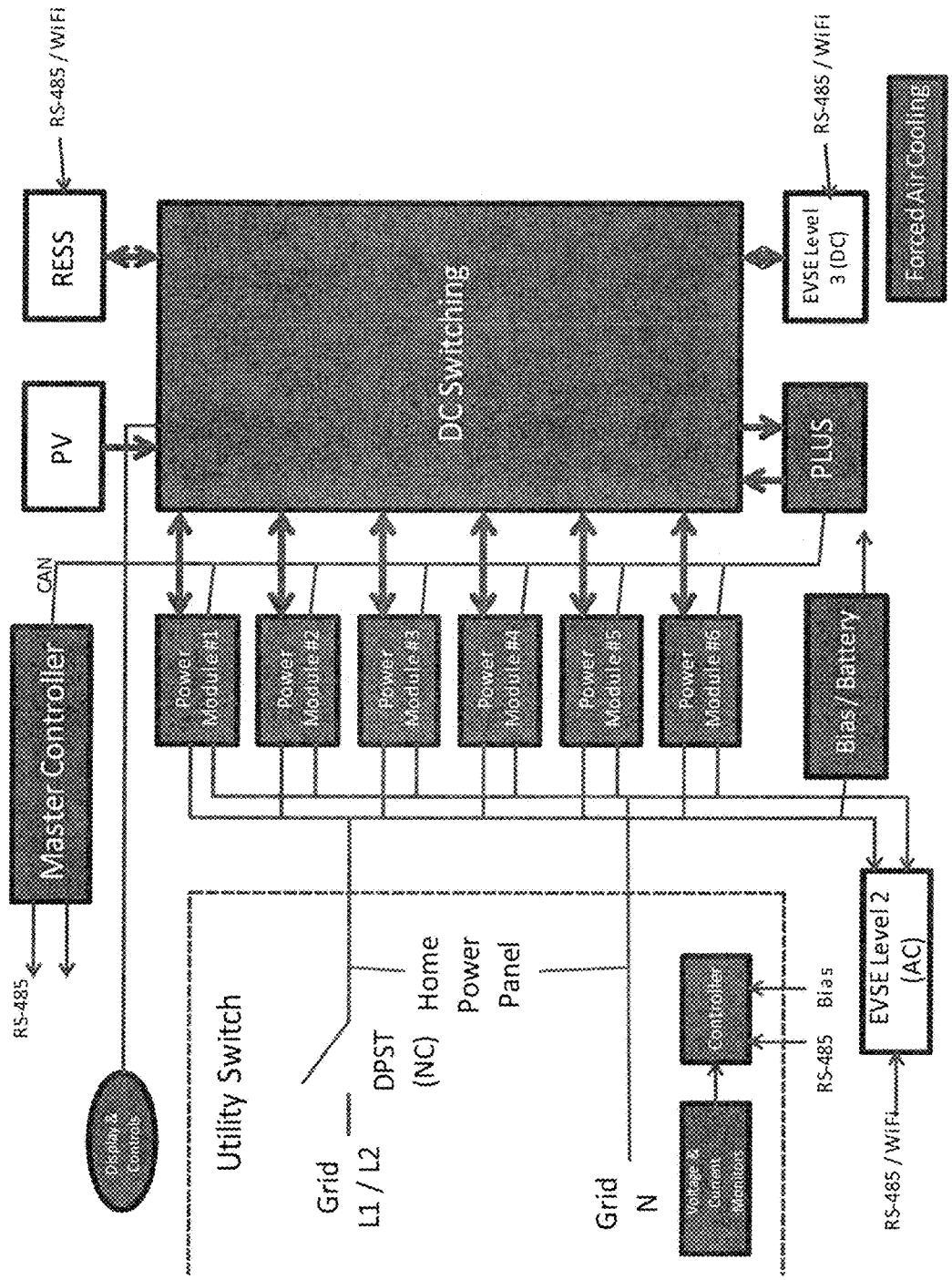
FIG. 10 is a further embodiment of the utility switch and smart power integrated node with multiple power modules and certain alternate functionality.

FIG. 9 is an alternate representation of the smart power integrated node, showing DC switching component 901, photovoltaic cell 902, RESS 903 (with RS-485 connection in this view), PLUS component 904 (for EV fast charging from RESS), and connection to master controller 909. Also shown is power module one 906 and power module two 907, connecting to the master controller 909 and PLUS component 904 and DC switching component 901. Power module one 906 and power module two 907 connect to home power panel and to the electrical grid or utility along L1/L2 line and N (neutral) line as shown. Master controller 909 also connects to an indicator and control component, providing user interface and/or display and control. Voltage and current monitors 911 and controller 912 are shown, with controller 912 having an RS-485 connection in this embodiment, and a connection to bias/battery 908, able to put out 12V power. The dotted line in this representation indicates utility switch 920, described above with respect to FIG. 1, where this is an alternate embodiment of such a utility switch. FIG. 10 is an alternate embodiment of the utility switch and smart power integrated node including additional power modules and suggesting forced air cooling and EVSE Level 3 (DC) and EVSE Level 2 (AC) functionality, as well as Wifi.

The DC switching component 901 allows for reconfiguring power module DC connections. Power modules can be reused for different purposes at different times. For example, one or more bi-directional AC/DC power module(s) can be used during daylight periods to provide for photovoltaic (DC) to grid (AC) power conversion and control. Without sunlight and to avoid having a dedicated power electronics, DC Switching allows for utilizing the same power module(s) for EV charging (or discharging).

The DC switching component 901 allows for power modules to be used in parallel or separately (or any combination thereof). For example, Power Modules operating in parallel may combine power for faster EV charging or higher photovoltaic power capability. The DC switching component 901 may be made up of a matrix of DC contactors and/or switches.

With respect to the PLUS component 904, this element combines power from the dwelling Rechargeable Energy Storage System (RESS, or home electrical storage device). Such functionality can be accomplished by the addition of a uni-directional DC to DC converter to bridge RESS and EV DC. Such a construction does not require galvanic isolation, though galvanic isolation may be employed if appropriate. Such functionality and hardware can also be applied to photovoltaic power supplied for EV charging.

Uni-directional DC to DC can be used independently from the power modules to allow for EV DC charging while the power modules are dedicated to other task(s). DC switching combined with the PLUS component 904 (unidirectional DC to DC from RESS to EV) combines utility grid power with home storage device/battery power.

The resultant system is a coordinated/integrated system that manages power flow between home/dwelling, utility (electrical) grid, solar (photovoltaic—PV) array, home/dwelling rechargeable Energy Storage System (RESS—commonly called the home battery), and electric vehicle for Vehicle Charging and Vehicle-To-Grid (V2G). The system allows power management to optimize for cost savings and grid utilization. Reuse of bi-directional power electronics contributes for best utilization of power. Analytics and optimization are provided, integrating these pieces and providing forecasting for anticipated energy needs and potential cost savings. The use of power electronics that in a typical PV system sit idle for hours per day can be used for EV or battery charging due to the use of bi-directional AC/DC power converters.

The system therefore provides for energy flow flexibility and reconfiguration capabilities to optimize usage, cost, and efficiency. The design includes user controls via on-unit or remote application (via cloud) monitoring and programming. Data from power program plan and actual usage may be uplinked to cloud for analysis and optimization of controls and recommendations. Optimized controls and recommendations are relayed to dwelling hardware, including the smart power integrated node, in home or via application, for appropriate controls/action(s). Operational benefits (via PLUS) include fast DC EV Charging (up to 50 kW) by combining power from the utility grid and drawing on RESS (20 kW). The system allows for reuse of high efficiency power converters (two 5 kW modules) that are dynamically reconfigurable to control AC to DC or DC to AC flow between different sources/loads. Also provided is the ability to island the home or dwelling (disconnect from utility grid) for stand alone operation (from PV or RESS). The present design thus includes a self reconfigurable power flow hardware system for usage and application. The system consists of multiple hardware sources that are self reconfigurable, such as power modules, and also includes monitoring of non-smart functions, including batteries and battery charging. The system has software optimization in the cloud based on analytics, based on a set of equations and algorithms. The current design combines algorithms with energy optimization. Multiple options or choices including economics, power reliability, grid services, and consumer devices are considered in providing a profile. In general, the profile is guided by outside world objectives and provides a beneficial result at the consumer level. Local constraints and priorities are contained within a local controller, and local priorities take the Recommended Operating Procedure (ROP) from the optimization engine in the cloud and apply local constraints and/or priorities. According to the present design, interpretation of the optimization results locally include consideration of physical constraints at the dwelling.

Working Example

The following description provides a working example that is not intended to be limiting but seeks to provide context to the foregoing description for teaching purposes. The example system is as follows:

| | Maximum Capacity (KW) | Charging Capacity (KW) | Discharging Capacity (KW) | Depth of Discharge |
|---|---|---|---|---|
| EV (DC) | 9.8 | 30 | 10 | 20% of Max Capacity |
| EV (AC) | 9.8 | 10 | 10 | 20% of Max Capacity |
| RESS Battery | 9.8 | 10 | 5 | 20% of Max Capacity |
| PLUS Line | 20 | — | — | — |

In this example, certain assumptions are made based on expected user profiles. The RESS battery, for example, is considered to start at 100% full at the beginning of a new day, such as 12 midnight. Two power modules are provided with the dwelling, each with capacity of 5 KW. The EV is 100% full charge at the beginning of new day, charged to 100% the previous day. The EV needs to be at 100% charge at 7 am, representing the assumed time a person drives to work/school and needs a full charge. Assume the EV is 85% charged at 6 pm, upon arrival at the dwelling from work or school. The EV is 100% charged at the end of the day, i.e. 11:59 pm, and the EV is not available or offline starting 7 am, the time the owner leaves for work or school with his/her vehicle. The EV is estimated to become available again at 6 pm, the time the owner returns from work or school and plugs in the EV.

Figure 11:
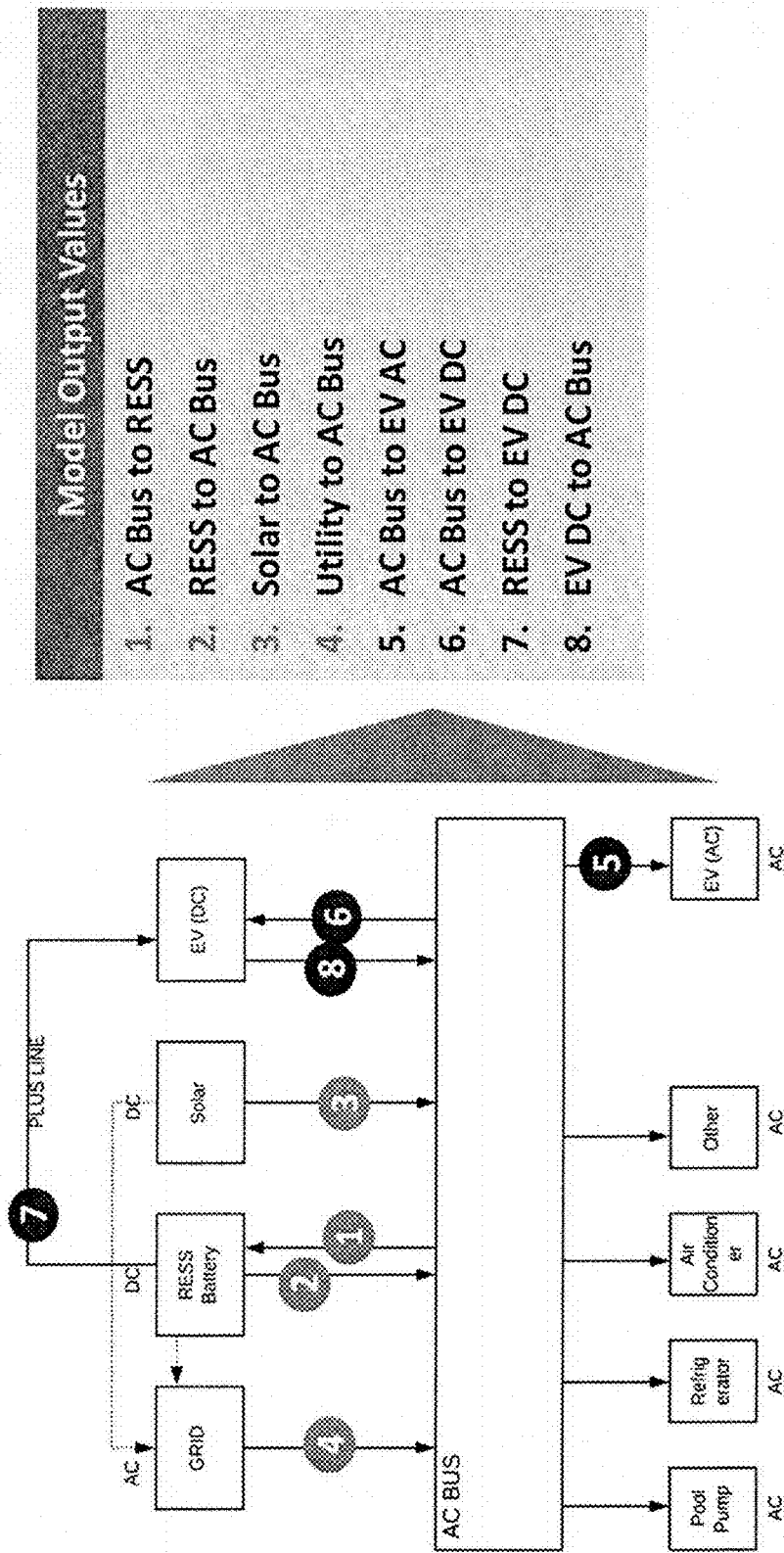
FIG. 11 represents shows an example implementation being optimized.
Figure 12A:
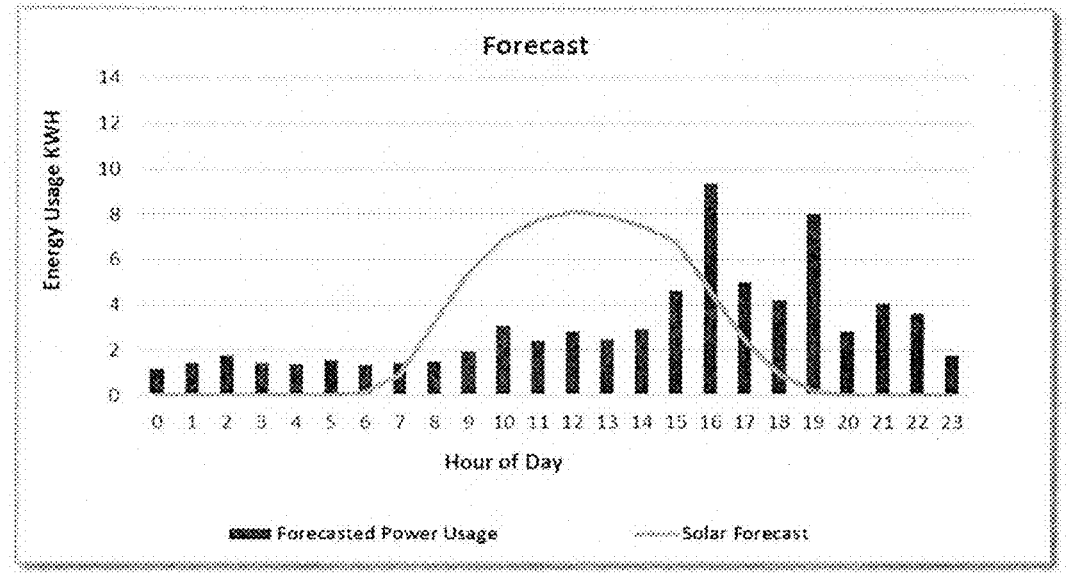
FIG. 12A shows a forecast output according the forecast, including the solar forecast and the forecasted power usage.
Figure 12B:
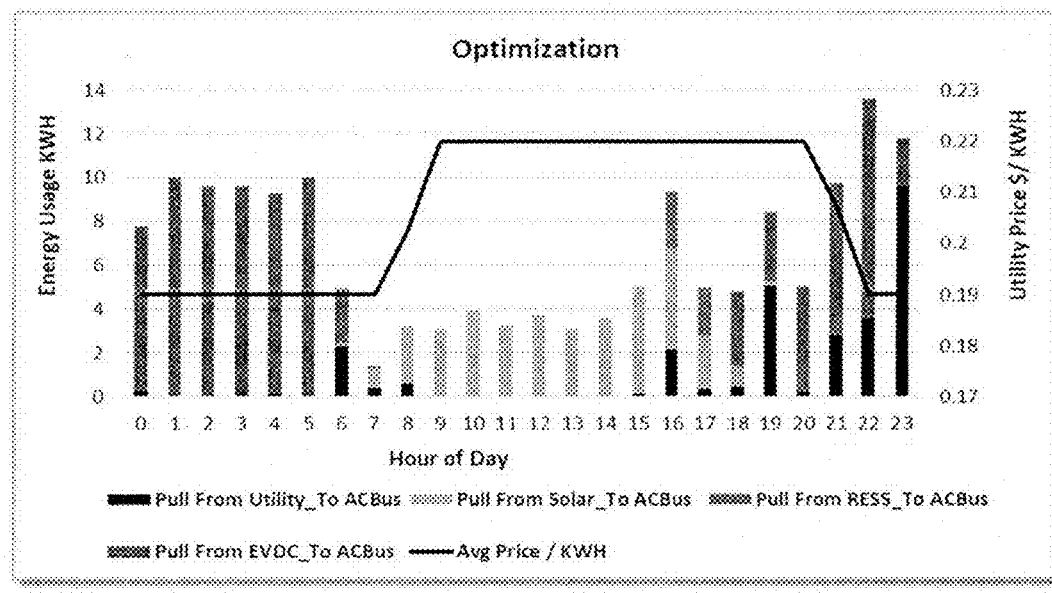
FIG. 12B shows optimization using the available devices in the dwelling in the example provided.
Figure 13:
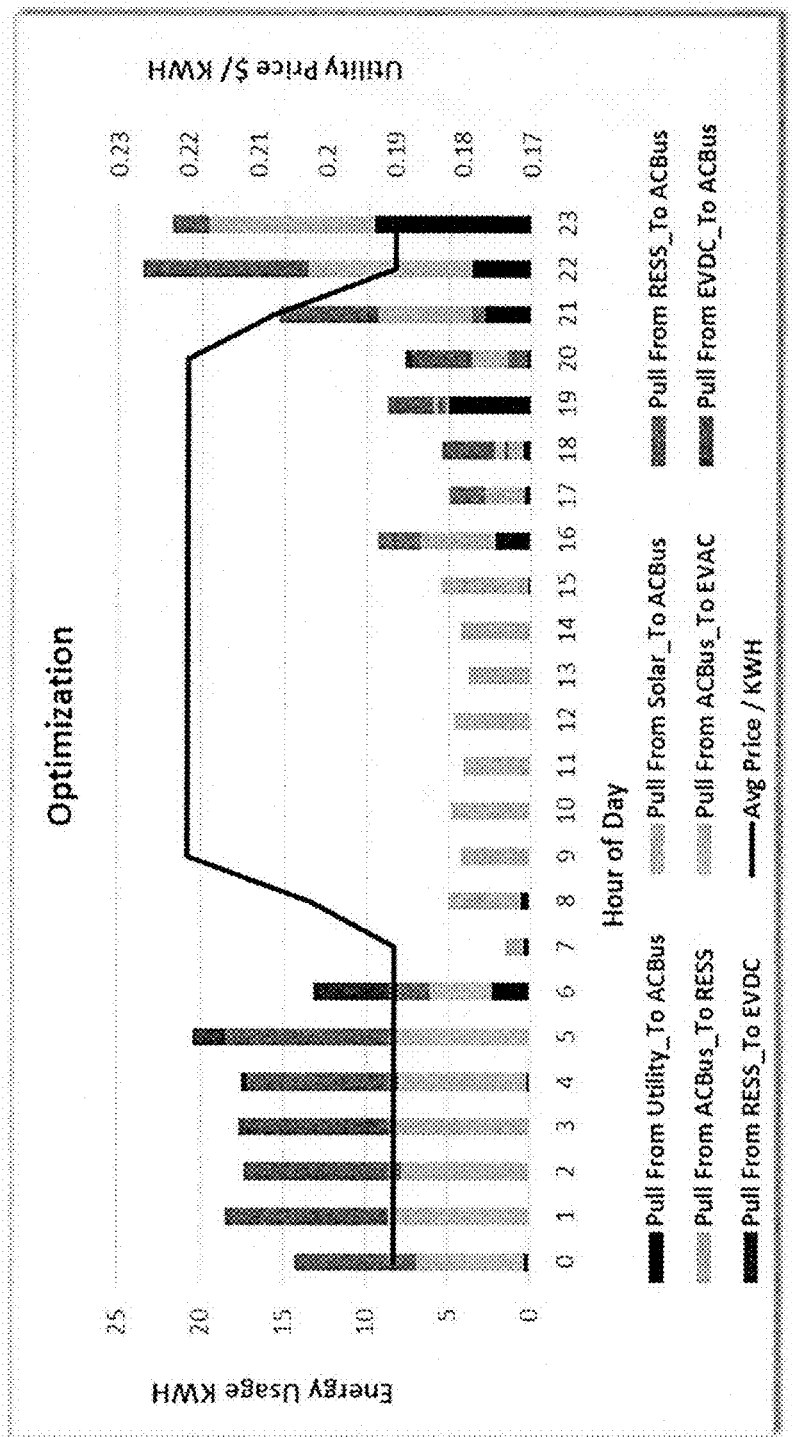
FIG. 13 shows an alternate example, with more components employed in the dwelling.

The foregoing represents a set of constraints, user preferences or priorities, and conditions expected, wherein optimization may be employed to minimize cost to the user and obtain improved efficiencies. Certain parameters and variables can change or be changed dynamically, representing a challenge in optimization. FIG. 11 represents the foregoing example in graphic form, with the various numbers representing output values for further examination. As an example, number 7 represents the power going from the RESS battery to the EV (DC). In one instance, the present device may also employ a device that converts AC to DC and/or DC to AC, using at least one and possibly more power modules of a certain size, such as 5 KW, to perform the conversion(s). FIG. 12A shows a relevant forecast, including the solar forecast and the forecasted power usage at each hour of the day, while FIG. 12B shows optimization using the available devices in the dwelling, including drawing power from different available sources, such as from the utility or grid to the AC Bus, from solar to the AC Bus, from RESS to the AC Bus, and so forth. The amount of power going to the AC Bus matches or exceeds the forecast for every time interval. FIG. 13 shows an alternate example, with more components from FIG. 11 employed than in FIG. 12B. This representation shows a decrease in cost of energy from $15.25 to $5.62. However, this representation includes a few considerations of note. First, no losses are reflected, such as losses from storage devices or from transporting energy. With no losses, energy is shown transmitted from the AC Bus to the EV at certain times of day, which may be less than optimal or even undesirable. The system may seek to avoid or prohibit functionality such as EV to AC Bus transmission, and in such cases, costs may increase. In general, the system in this example relies more on the EV than the battery. The system in this situation the system may reprioritize to use RESS first over EV if both are available.

Figure 14:
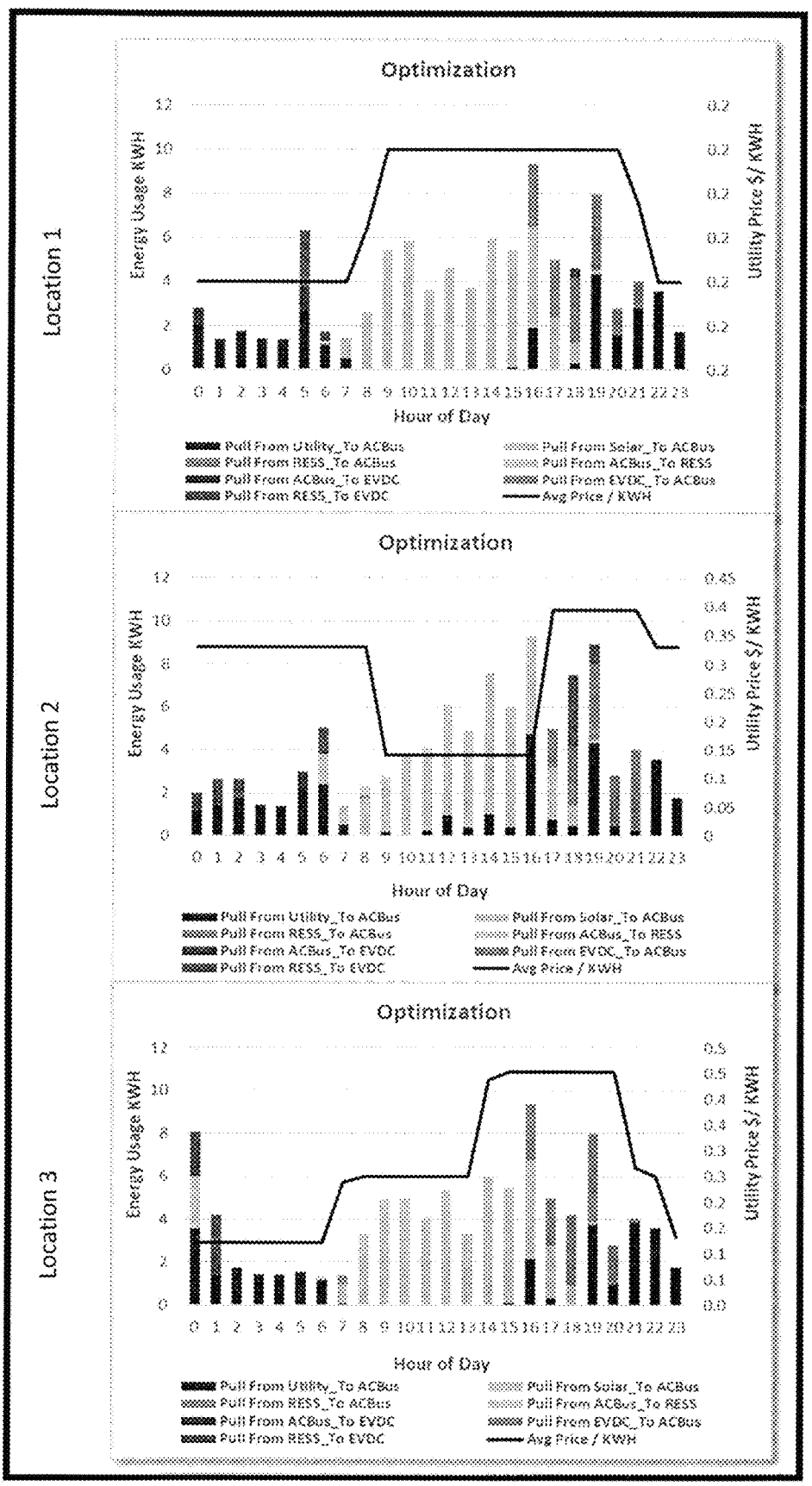
FIG. 14 shows three different energy pricing scenarios, using the example arrangement discussed.

Different energy prices may also affect results. FIG. 14 shows three different energy pricing situations, representing three different locations such as three different municipal energy providers. FIG. 14 contemplates the example arrangement discussed above in FIG. 11, with the result being three different energy profile optimizations and varying energy distributions. Price per KW can vary significantly and power profiles and costs can also vary depending on the cost of energy being supplied from the grid.

Optimization in the present situation uses data collected over time, including solar, temperature, humidity, and may apply an importance to variables, and uses energy readings between the various devices in the dwelling in an effort to shift energy around and lower the overall cost of powering the home. As may be appreciated, this can be a dynamic process, as users may, for example, employ different devices at different times, such as washing machines, air conditioners, etc., and in certain instances actual operation may differ from expected operation. Optimization may employ any number of techniques, including linear regression, fitting a curve or line to data, a decision tree where each node is a decision in the process of determining dwelling operation, and/or random forest, creating a number of decision trees and averaging the output from each tree, where every tree includes randomly selected training sets, including both features and rows. In general, optimization takes known constraints, conditions, user preferences, priorities, limitations, available devices, and energy transferred between devices, and attempts to shift burdens to minimize the amount of energy received from the grid, thereby decreasing costs of energy to the user.

Optimization may alternately be considered as follows. Analysis and optimization in the present design includes statistical forecasting in R and numerical optimization in CMPL. The system "wrapper" calls SQL to access data stored in the Master DB. The system wrapper calls R and CMPL, and writes the output back to the Master DB. The system stores data inputs to the forecasting and optimization models in the Master DB tables Data (node level consumption at regular, e.g. five minute, intervals) and DeviceData (device level consumption at regular, e.g. five minute, intervals).

Figure 15:
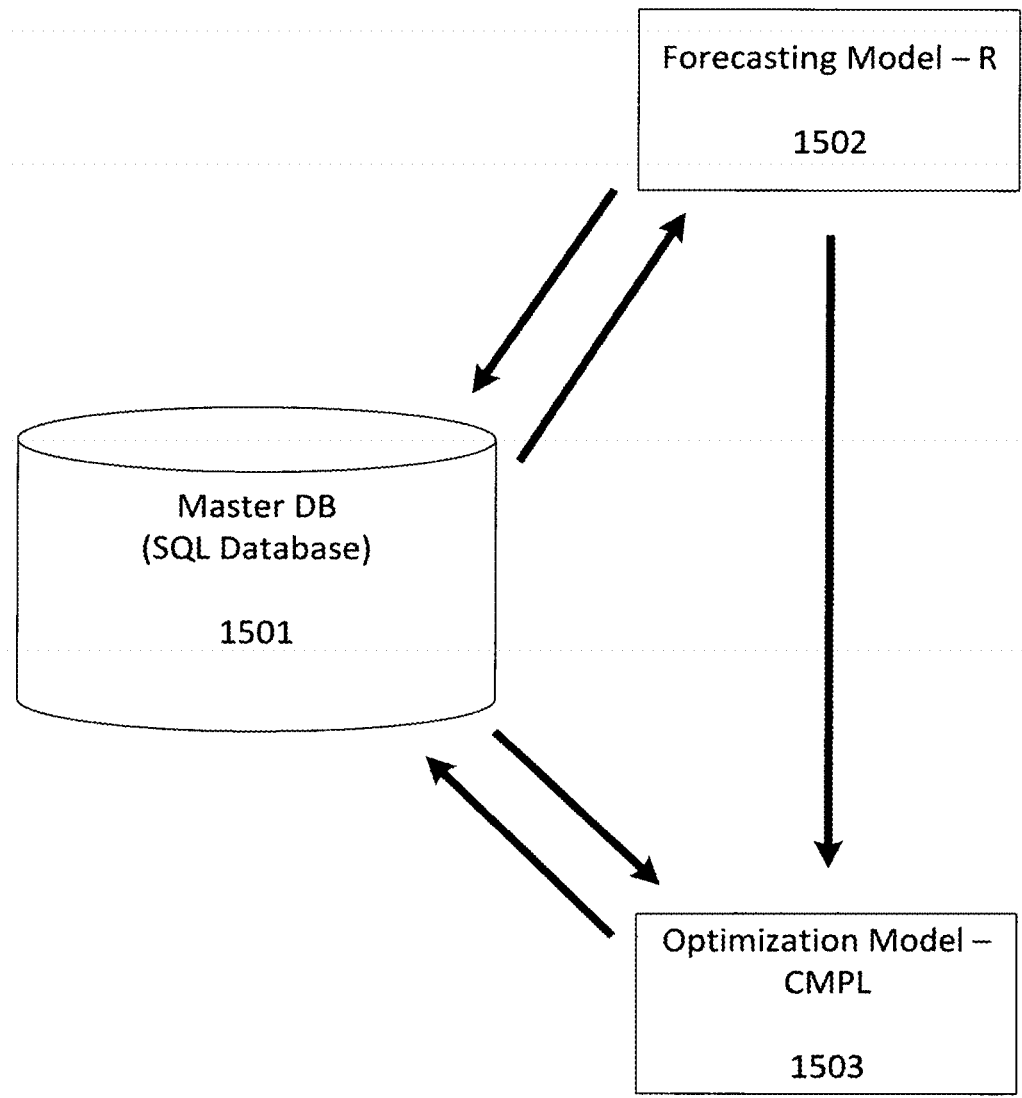
FIG. 15 illustrates the interrelationship between the master database Master DB, the Forecasting Model—R, and the Optimization Model—CMPL 1503.

FIG. 15 illustrates the interrelationship between the master database Master Db 1501, the Forecasting Model R 1502, and the Optimization Model CMPL 1503. In one embodiment, the Master DB is a SQL database, forecasting employs R software, optimization employs CMPL software, and the system wrapper employs Python. Other platforms or software/hardware/firmware solutions may be employed. The system as shown may be located in the cloud, i.e. a remote bank of servers, or may be local or in any reasonable configuration or architecture.

Figure 16:
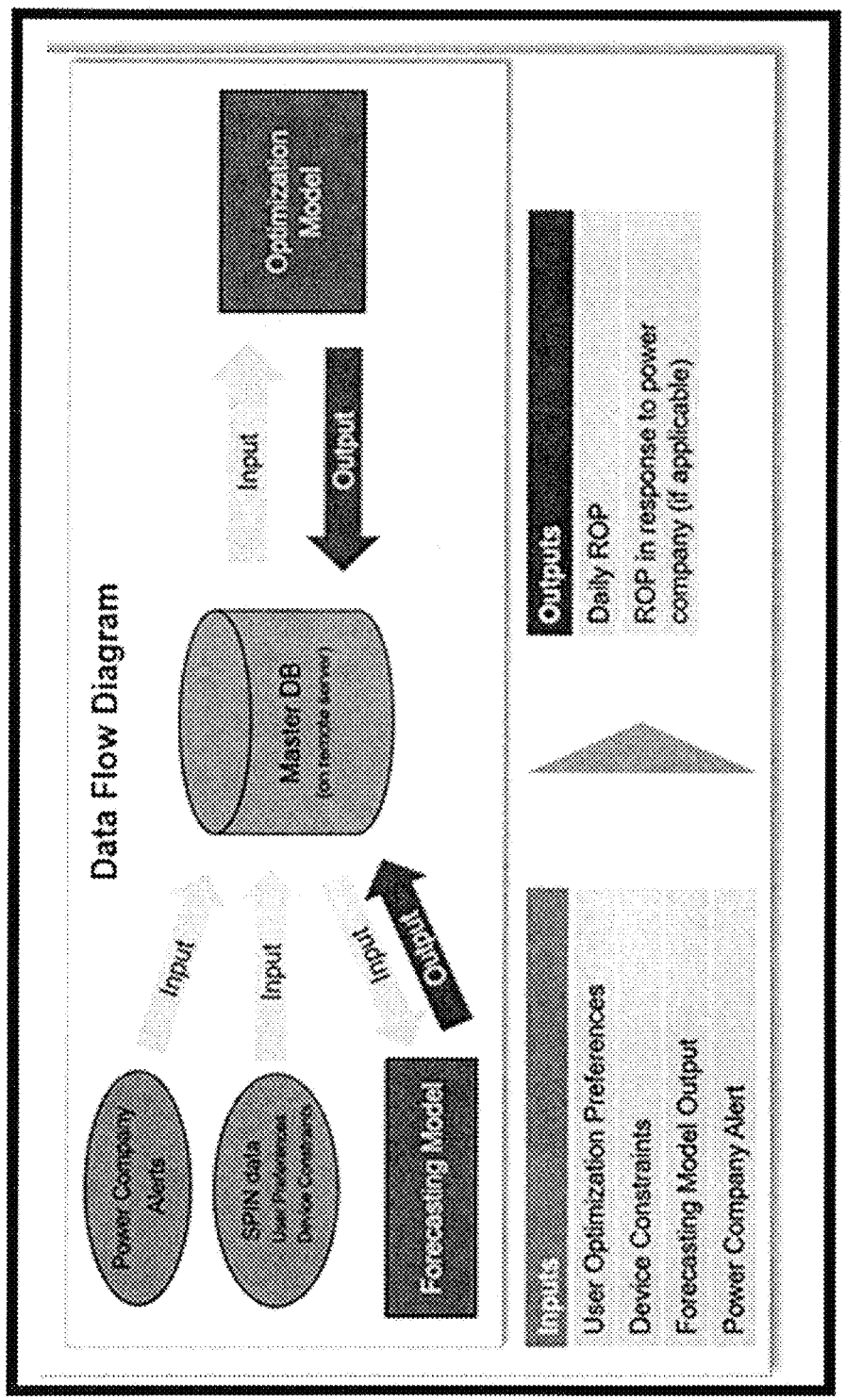
FIG. 16 illustrates one embodiment of a system optimization model.

One embodiment of a system optimization model is shown in FIG. 16. The system receives power company alerts as well as data in the form of user preferences and device constraints. The forecasting model also provides inputs and system outputs include a daily ROP and an ROP in response to a power company or utility if available. The optimization model pulls inputs from the Master Database (DB), runs optimization processing, then outputs the daily Recommended Operating Procedure (ROP) back into the Master DB.

In one embodiment, the optimization model is designed in CMPL programming software. The optimization model is s mathematical model (Mixed Integer Program). The system uses linear algebra to find an optimal value in finite dimensional vector space. One example of a mathematical program used by the system is presented below—

Objective Function:
Min→sum{j in Intervals, k in Source: SupplyToBattery[j,k] *Cost[j,k]+SupplyToACBus[j,k] *Cost[j,k] }
Minimize total cost Constraints:
{i in Devices, j in Intervals: Usage[i,j]=Forecast[i,j];}
Usage equals forecast
{j in Intervals: UsageEV[j]+sum{i in Devices: Usage[i,j]}= SupplyToBattery [j]+sum {k in Source: SupplyToACBus [j,k]};}
Supply Demand for AC Bus
{j in Intervals, k in Source: SupplyToBattery [j,k]+SupplyToACBus [j,k]<=Capacity
[j,k];} #Do not use more solar than available The system typically employs branch and bound logic to solve the MIP. Optimization entails computing a daily ROP, representing recommended consumption interval for smart devices and non-smart devices. Non-smart devices may be estimated to give the user additional information on their energy usage. Optimization also entails an electricity source choice, specifically whether and how much to consume from grid, solar, battery, or plug-in EV (typically DC only).

The system employs a node level optimization model. Node level optimization models the behavior of entire node and not individual devices in the node.

Figure 17:
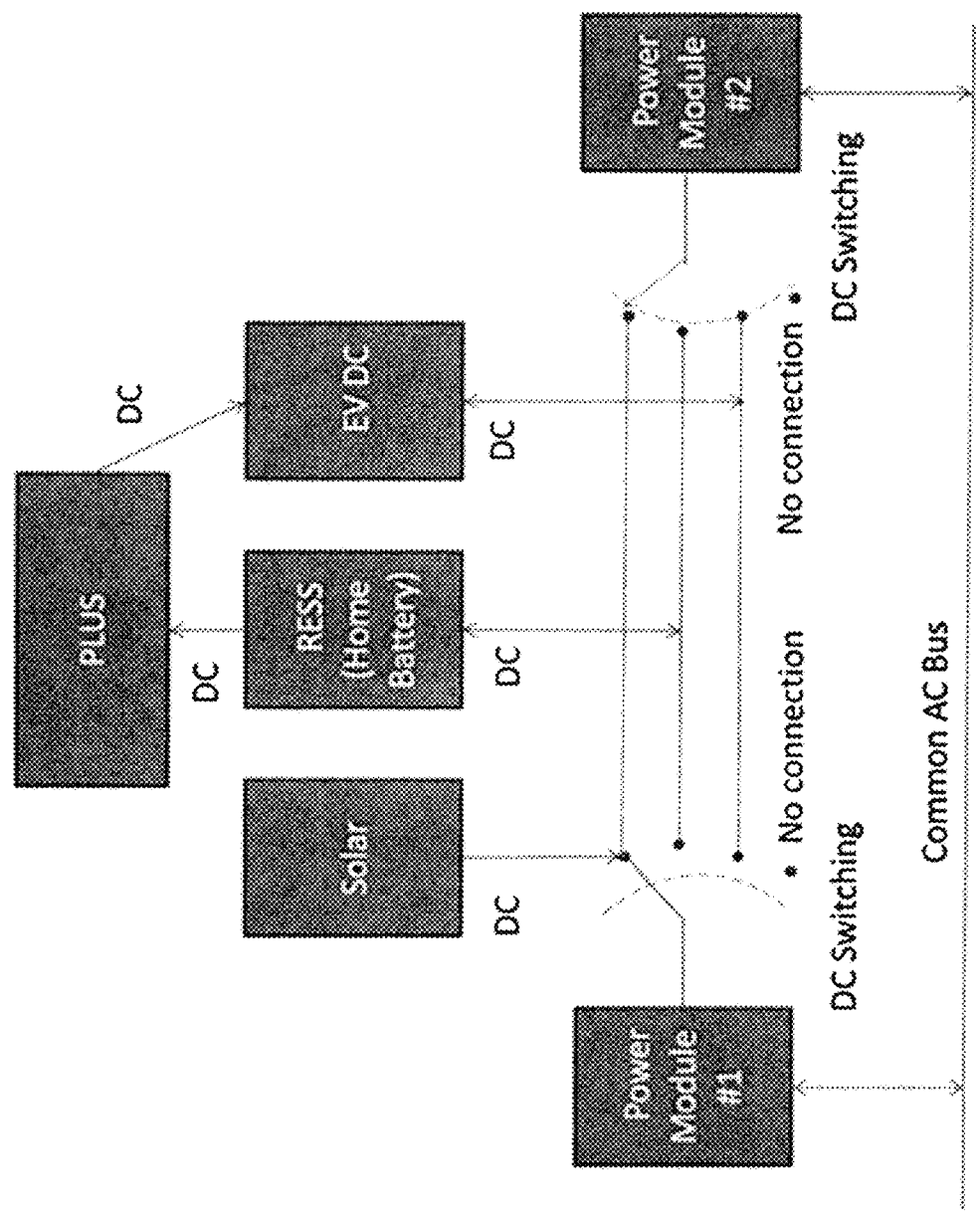
FIG. 17 is a system diagram of dwelling components.

FIG. 17 is a system diagram of dwelling components. In FIG. 17, the power modules are bi-directional AC/DC converters. The PLUS component is a unidirectional DC/DC converter. Power Module 1 and Power Module 2 perform DC switching in this embodiment to either nothing (no connection), or one of the three DC components pictured—Solar, RESS, or EV (DC). Each power module is also connected to a common AC bus. The system solves the problem formulated as a Mixed Integer Program (MIP). The system makes the following assumptions about the devices, and specifically those pictured in the embodiment of FIG. 17. First, the model considers two types of devices—Home and Electric Vehicle—AC Charging. DC fast charging may be modeled. Home, EV(AC), and RESS battery pull power from a common AC bus. The AC bus receives power from three sources, namely Solar, Grid and RESS battery. Power being received from the EV-DC may also be modeled or considered. The system also considers or determines selling back power to the grid from Solar/RESS battery. The EV (AC) and RESS have the characteristics of a storage battery, in that they cannot exceed charging and discharging rate, cannot exceed maximum battery capacity, and the battery capacity increases and/or decreases as the system transmits power to the device or receives power from the device. The system may shift consumption at the dwelling to a less expensive time interval. The system in this embodiment includes a power module that converts AC to DC and vice-versa. A typical system does not employ more than two power modules, such as power modules having 5 KW capacity each, at one time.

The model determines, with an overall objective of minimizing total cost, the power consumption of Home and EV in each time interval received from the AC Bus, the power flow from the RESS battery, solar element(s), and grid to the AC Bus, and the power flow from the AC Bus to the RESS. Device level optimization is also available in the current design, where additional assumptions are made beyond node level optimization to determine the device level model. The model considers various types or classes of devices, such as pool pump, refrigerator, air conditioning, non-smart devices (generally categorized as "other") and electric vehicle—AC charging or DC fast charging. All five devices are considered to obtain power from a common AC bus. The AC bus receives power from certain devices such as solar, grid and RESS battery, and in some instances EV-DC. The system determines a recommended consumption for certain high power devices, e.g., refrigerator, AC and other devices, where the system seeks to match the forecasted demand during a particular time interval. The system further accounts for usage considerations, e.g. shifting consumption of a pool pump to a cheaper time interval, or shifting power consumption of an EV to a cheaper time interval given user constraints, e.g. a user wants a full charge by 7 a.m. to drive to work. Based on such constraints, the system determines consumption of every device in each time interval from the AC Bus, power flow from the RESS battery, solar elements and grid to the AC Bus, and power flow from AC Bus into the RESS.

While the initial optimization model is based on minimizing cost, additional settings can be established, by the user or otherwise, and the optimization model performs differently depending on the setting(s) selected. Possible optimization settings are listed include optimizing cost, and/or optimizing green energy usage. Optimizing energy usage calls for the system to consider that the dwelling uses solar and RESS battery rather than receiving energy from the grid. Additional constraints can be added such as in the case of the user wanting to exclusively use green energy. The system can optimize in response to a power company mandate, such as rolling black out and constant grid usage. Other optimization considerations include a subscription service (selling power back to grid, islanding (no power being received from the grid), etc. Thus according to one embodiment of the present design, there is provided a dwelling power management system configured to interface with a remote server arrangement, the dwelling power management system comprising a smart power integrated node located at a dwelling and configured to transit information to and receive information from the remote server arrangement, wherein the smart power integrated node controls power applied to dwelling electrical power hardware components according to a recommended operating procedure (ROP), and a utility switch connected to the smart power integrated node, the utility switch configured to interface with dwelling external power sources and a dwelling power distribution arrangement. The smart power integrated node is configured to transmit dwelling power usage information and dwelling user preferences to the remote server arrangement and the remote server arrangement is configured to evaluate relevant information including dwelling power usage information and dwelling user preferences and dwelling external factors to develop an optimized ROP. The remote server arrangement is configured to transmit the optimized ROP to the smart power integrated node, and the smart power integrated node is configured to operate according to the optimized ROP.

Thus with respect to optimization, the system collects a great deal of data about the dwelling, the weather, power costs, operation at different times of day, operation of various dwellings at different times of day, vehicles and components or items available at certain times of day, and so forth. Based on prior performance and expected performance and the data available, the system performs a least squares fit line to the data. The system may add certain variables and direct the function to minimize the errors that were created by the fit for existing data. The system seeks future data sets that reduce errors created by existing data sets and may do this by adjusting the future data sets. The optimization in one embodiment is a minimization of an error function. Thus, how appliances are used, and when, depend on the minimization of the errors driven by the variables in the functions.

In general, differences from previous systems and the present system are as follows. In previous systems, energy monitoring includes the monitoring of energy production, while in the present system real time energy consumption is monitored, both loads and energy production, and values are reported to grid control. Energy forecasting in previous systems was nonexistent, while the current design provides periodic forecasting, such as in five minute increments, half hour, hour, or any desired time period. Such forecasts are generated based on node (dwelling) energy usage data and situation factors such as weather, day of the week, time of day, and historical learnings. Predictions are compared to historical data to determine processing and optimization yielding the highest accuracy for the node. In the area of energy optimization, previous systems either provided a fixed assumption based on maximizing self-consumption of solar energy, or changing consumer behavior, such as changing activity time. The present system provides power flow control from multiple sources and/or loads. Preferences, or priorities and forecast based optimization are provided. Control of energy entails consideration of current needs, anticipated needs, equipment constraints, solar production, grid energy cost, and grid conditions/requests. The system performs a recommended operating strategy analysis in reference to dwelling owner preference settings. Further, the present system offers power flow control to meet consumer requirements and preferences. Operational control in previous systems included control based only on voltage monitoring. In the current system, controls adjust for deviation between planned and actual energy availability and usage. Communications in previous systems are client based, whereas the present system allows for client or server communications. Power control of the entire ecosystem had previously been open loop, whereas the present system is closed loop in nature and offers an ability to enhance performance through observation and learning.

Thus according to one embodiment, there is provided a dwelling power management system configured to interface with a remote server arrangement, the dwelling power management system comprising a smart power integrated node located at a dwelling and configured to transit information to and receive information from the remote server arrangement, wherein the smart power integrated node controls power applied to dwelling electrical power hardware components according to a recommended operating procedure (ROP), and a utility switch connected to the smart power integrated node, the utility switch configured to interface with dwelling external power sources and a dwelling power distribution arrangement. The smart power integrated node is configured to transmit dwelling power usage information and dwelling user preferences to the remote server arrangement and the remote server arrangement is configured to evaluate relevant information including dwelling power usage information and dwelling user preferences and dwelling external factors to develop an optimized ROP. The remote server arrangement is configured to transmit the optimized ROP to the smart power integrated node, and the smart power integrated node is configured to operate according to the optimized ROP.

According to a further embodiment, there is provided a dwelling power management system comprising a smart power integrated node located at a dwelling and configured to transit information to and receive information from a remote server arrangement, wherein the smart power integrated node selectively controls power applied to dwelling electrical power hardware components according to a recommended operating procedure (ROP), and a utility switch connected to the smart power integrated node, the utility switch configured to control distribution of electrical power received from a dwelling external power source. The smart power integrated node is configured to transmit dwelling power usage information and dwelling user preferences to the remote server arrangement and the remote server arrangement is configured to evaluate relevant information including dwelling power usage information and dwelling user preferences and dwelling external factors to develop an optimized ROP. The remote server arrangement is configured to transmit the optimized ROP to the smart power integrated node, and the smart power integrated node is configured to operate electrical hardware devices in the dwelling according to the optimized ROP.

According to another embodiment, there is provided a dwelling power management system comprising a smart power integrated node located at a dwelling and configured to transit information to and receive information from a remote server arrangement, wherein the smart power integrated node controls power applied to dwelling electrical power hardware components according to a recommended operating procedure (ROP) and a utility switch connected to the smart power integrated node, the utility switch configured to interface with dwelling external power sources and a dwelling power distribution arrangement. The smart power integrated node is configured to transmit dwelling power usage information and dwelling user preferences to the remote server arrangement and the remote server arrangement is configured to receive external dwelling relevant information and process received information to develop an optimized ROP. The remote server arrangement is configured to transmit the optimized ROP to the smart power integrated node and smart power integrated node is configured to operate electrical hardware devices in the dwelling according to the optimized ROP.

The foregoing description of specific embodiments reveals the general nature of the disclosure sufficiently that others can, by applying current knowledge, readily modify and/or adapt the system and method for various applications without departing from the general concept. Therefore, such adaptations and modifications are within the meaning and range of equivalents of the disclosed embodiments. The phraseology or terminology employed herein is for the purpose of description and not of limitation.

What is claimed is:

1. A dwelling power management system configured to interface with a remote server arrangement, the dwelling power management system comprising:
    a smart power integrated node located at a dwelling and configured to transit information to and receive information from the remote server arrangement, wherein the smart power integrated node controls power applied to dwelling electrical power hardware components according to a recommended operating procedure (ROP); and
    a utility switch connected to the smart power integrated node, the utility switch configured to interface with dwelling external power sources and a dwelling power distribution arrangement, connect and disconnect the dwelling external power sources to the dwelling electrical power hardware components, sense the current of the electrical power hardware components and provide the sensed current to the smart power integrated node;
    wherein the smart power integrated node is configured to transmit dwelling power usage information based on the sensed current and dwelling user preferences to the remote server arrangement and the remote server arrangement is configured to evaluate relevant information including the dwelling power usage information, the dwelling user preferences, and dwelling external factors including weather and day of week to develop an optimized ROP;
    wherein the remote server arrangement is configured to develop the optimized ROP based on electricity requirements for individual dwelling electrical power hardware components, electricity requirements for all dwelling electrical power hardware components in the dwelling, and usage considerations based on dwelling user preferences and energy cost minimization factors;
    wherein the remote server arrangement is configured to transmit the optimized ROP to the smart power integrated node;
    and wherein the smart power integrated node is configured to operate at least one of the dwelling electrical power hardware components and connect or disconnect the utility switch according to the optimized ROP.

2. The dwelling power management system of claim 1, wherein the smart power integrated node is configured to control a power storage device located with the dwelling.

3. The dwelling power management system of claim 1, wherein the optimized ROP accounts for at least one of existing weather conditions or predicted weather conditions.

4. The dwelling power management system of claim 1, wherein the smart power integrated node is configured to control power distribution to at least one of an electric vehicle, a photovoltaic cell, or a Rechargeable Energy Storage System (RESS).

5. The dwelling power management system of claim 1, wherein the utility switch comprises a utility switch controller configured to control switches to disable the smart power integrated node.

6. The dwelling power management system of claim 5, wherein the utility switch controller further controls the switches configured to switch off electricity received from at least one of the dwelling external power sources sere.

7. The dwelling power management system of claim 1, wherein the dwelling power distribution arrangement comprises a dwelling power panel configured to control home electrical power loads.

8. A dwelling power management system comprising:
    a smart power integrated node located at a dwelling and configured to transit information to and receive information from a remote server arrangement, wherein the smart power integrated node selectively controls power applied to dwelling electrical power hardware components according to a recommended operating procedure (ROP); and
    a utility switch connected to the smart power integrated node, the utility switch configured to control distribution of electrical power received from a dwelling external power source, connect and disconnect the dwelling external power source to the dwelling electrical power hardware components, sense the current of the electrical power hardware components and provide the sensed current to the smart power integrated node;
    wherein the smart power integrated node is configured to transmit dwelling power usage information based on the sensed current and dwelling user preferences to the remote server arrangement and the remote server arrangement is configured to evaluate relevant information including the dwelling power usage information, the dwelling user preferences, and dwelling external factors including weather and day of week to develop an optimized ROP;

wherein the remote server arrangement is configured to develop the optimized ROP based on electricity requirements for individual dwelling electrical power hardware components, electricity requirements for all dwelling electrical power hardware components in the dwelling, and usage considerations based on dwelling user preferences and energy cost minimization factors;

wherein the remote server arrangement is configured to transmit the optimized ROP to the smart power integrated node;

and wherein the smart power integrated node is configured to operate at least one of the dwelling electrical power hardware components and connect or disconnect the utility switch according to the optimized ROP.

9. The dwelling power management system of claim 8, wherein the smart power integrated node is configured to control a power storage device located with the dwelling.

10. The dwelling power management system of claim 8, wherein the optimized ROP accounts for at least one of existing weather conditions or predicted weather conditions.

11. The dwelling power management system of claim 8, wherein the smart power integrated node is configured to control power distribution to at least one of an electric vehicle, a photovoltaic cell, or a Rechargeable Energy Storage System (RESS).

12. The dwelling power management system of claim 8, wherein the utility switch comprises a utility switch controller configured to control switches to disable the smart power integrated node.

13. The dwelling power management system of claim 12, wherein the utility switch controller further controls the switches configured to switch off electricity received from the dwelling external power source.

14. The dwelling power management system of claim 8, wherein the optimized ROP accounts for at least one of weather, utility pricing, alerts, or user constraints provided by the user via a computing device to the smart power integrated node.

15. A dwelling power management system comprising:
a smart power integrated node located at a dwelling and configured to transit information to and receive information from a remote server arrangement, wherein the smart power integrated node controls power applied to dwelling electrical power hardware components according to a recommended operating procedure (ROP); and a utility switch connected to the smart power integrated node, the utility switch configured to interface with dwelling external power sources and a dwelling power distribution arrangement, connect and disconnect the dwelling external power sources to the dwelling electrical power hardware components, sense the current of the electrical power hardware components and provide the sensed current to the smart power integrated node;

wherein the smart power integrated node is configured to transmit dwelling power usage information based on the sensed current and dwelling user preferences to the remote server arrangement and the remote server arrangement is configured to also receive external dwelling relevant information including weather and day of week and process received information to develop an optimized ROP;

wherein the remote server arrangement is configured to develop the optimized ROP based on electricity requirements for individual dwelling electrical power hardware components, electricity requirements for all dwelling electrical power hardware components in the dwelling, and usage considerations based on dwelling user preferences and energy cost minimization factors;

wherein the remote server arrangement is configured to transmit the optimized ROP to the smart power integrated node and the smart power integrated node is configured to operate at least one of the dwelling electrical power hardware components and connect or disconnect the utility switch according to the optimized ROP.

16. The dwelling power management system of claim 15, wherein the smart power integrated node is configured to control a power storage device located with the dwelling.

17. The dwelling power management system of claim 15, wherein the optimized ROP accounts for at least one of existing weather conditions or predicted weather conditions.

18. The dwelling power management system of claim 15, wherein the smart power integrated node is configured to control power distribution to at least one of an electric vehicle, a photovoltaic cell, or a Rechargeable Energy Storage System (RESS).

19. The dwelling power management system of claim 15, wherein the utility switch comprises a utility switch controller configured to control switches to disable the smart power integrated node.

20. The dwelling power management system of claim 19, wherein the utility switch controller further controls the switches configured to switch off electricity received from at least one of the dwelling external power sources.

* * * * *